(12) United States Patent
Baek et al.

(10) Patent No.: US 12,154,819 B2
(45) Date of Patent: *Nov. 26, 2024

(54) WAFER CLEANING APPARATUS AND METHOD OF CONTROLLING THE SAME

(71) Applicant: ZEUS CO., LTD., Hwaseong-si (KR)

(72) Inventors: Seung Dae Baek, Hwaseong-si (KR); Kuem Dong Heo, Ansan-si (KR); Sung Yup Kim, Suwon-si (KR); Jae Hwan Son, Hwaseong-si (KR); Nam Jin Kim, Suwon-si (KR); Jun Goo Park, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/718,982

(22) Filed: Apr. 12, 2022

(65) Prior Publication Data

US 2022/0344194 A1    Oct. 27, 2022

(30) Foreign Application Priority Data

Apr. 21, 2021  (KR) .......................... 10-2021-0051540
Apr. 21, 2021  (KR) .......................... 10-2021-0051542

(51) Int. Cl.
| | | |
|---|---|---|
| *H01L 21/683* | (2006.01) | |
| *B08B 3/02* | (2006.01) | |
| *B08B 3/12* | (2006.01) | |
| *B08B 13/00* | (2006.01) | |
| *H01L 21/02* | (2006.01) | |

(Continued)

(52) U.S. Cl.
CPC .......... *H01L 21/6838* (2013.01); *B08B 3/022* (2013.01); *B08B 3/12* (2013.01); *B08B 13/00* (2013.01); *H01L 21/02076* (2013.01); *H01L 21/67051* (2013.01); *H01L 21/67132* (2013.01); *H01L 21/68728* (2013.01)

(58) Field of Classification Search
CPC .......... H01L 21/6838; H01L 21/68728; H01L 21/67051; H01L 21/02076; H01L 21/67132; B08B 3/12; B08B 13/00; B08B 3/022

See application file for complete search history.

(56) References Cited

U.S. PATENT DOCUMENTS

| | | | | |
|---|---|---|---|---|
| 2003/0008604 | A1* | 1/2003 | Boo ....................... | B24B 37/30 451/388 |
| 2016/0300751 | A1* | 10/2016 | Albert .............. | H01L 21/67126 |
| 2022/0344195 | A1* | 10/2022 | Baek ...................... | B08B 3/022 |

FOREIGN PATENT DOCUMENTS

| | | |
|---|---|---|
| JP | 2018-113281 | 7/2018 |
| KR | 10-2016-0122067 | 10/2016 |
| TW | 326433 | 2/1998 |

OTHER PUBLICATIONS

Machine Translation of KR 101559043 to Park et al. (Year: 2015).*

* cited by examiner

*Primary Examiner* — Benjamin L Osterhout
(74) *Attorney, Agent, or Firm* — KILE PARK REED & HOUTTEMAN PLLC

(57) ABSTRACT

A wafer cleaning apparatus of the present invention includes a vacuum chuck unit on which a wafer is mounted, a ring cover unit facing a retainer ring portion of the wafer, an expander module installed to move the ring cover unit and configured to press the retainer ring portion toward the vacuum chuck unit such that a gap between dies of the wafer widens, and a chucking module installed in the vacuum chuck unit to restrain the ring cover unit pressed by the expander module to the vacuum chuck unit.

10 Claims, 21 Drawing Sheets

(51) Int. Cl.
*H01L 21/67* (2006.01)
*H01L 21/687* (2006.01)

WAFER CLEANING APPARATUS AND METHOD OF CONTROLLING THE SAME

CROSS-REFERENCE TO RELATED APPLICATION

This application claims the benefit under 35 U.S.C. § 119(a) of Korean Patent Application No. 10-2021-0051540, filed on Apr. 21, 2021 and No. 10-2021-0051542, filed on Apr. 21, 2021 in the Korean Intellectual Property Office, the entire disclosure of which is incorporated herein by reference for all purposes.

BACKGROUND

Technical Field

The present invention relates to a wafer cleaning apparatus and a method of controlling the same, and more particularly, to a wafer cleaning apparatus capable of improving wafer cleaning performance and shortening a wafer cleaning time, and a method of controlling the same.

Discussion of the Background

In general, in a semiconductor process, an etching process of etching wafers, a singulation process of sawing the wafers into a plurality of dies, and a cleaning process of cleaning the wafers are performed. A wafer processing apparatus is used in the wafer etching process or the cleaning process.

The wafer processing apparatus includes a rotary table which is rotatably installed and on which a wafer is mounted, and a sealing ring coupled to an edge area of the rotary table in a ring shape. A processing solution is supplied onto the wafer mounted on the rotary table while the rotary table rotates.

However, in the conventional wafer processing apparatus, when a wafer in which a plurality of dies are sawn is cleaned, it may be difficult to remove foreign materials remaining in gaps between the plurality of dies. In addition, since a cleaning time should be sufficiently extended in order to remove the foreign materials from the gaps between the plurality of dies, the cleaning time may increase.

In addition, a process of coupling a sealing ring to an upper portion of a rotary table is cumbersome, and a coupling completion state of the sealing ring is not constant when the sealing ring is coupled, resulting in a coupling error (distortion or the like). Furthermore, when the coupling error of the sealing ring is caused, a processing solution may permeate into a part outside the sealing ring, and thus a structure at a circumferential portion of the table may be damaged.

In addition, a wafer fixing module is installed to prevent a position of a wafer from being shifted, and a sealing ring fixing module is installed to fix the sealing ring. Accordingly, the structure of the wafer processing apparatus may become complicated, and manufacturing costs thereof can increase.

A background technique of the present invention is disclosed in Korean Patent Publication No. 10-2016-0122067 (published on Oct. 21, 2016, and titled "Wafer processing apparatus and sealing ring for wafer processing apparatus").

SUMMARY OF THE INVENTION

The present invention is directed to providing a wafer cleaning apparatus capable of improving wafer cleaning performance and shortening a wafer cleaning time, and a method of controlling the same.

According to an aspect of the present invention, there is provided a wafer cleaning apparatus includes a vacuum chuck unit on which a wafer is mounted, a ring cover unit facing a retainer ring portion of the wafer, an expander module installed to move the ring cover unit and configured to press the retainer ring portion toward the vacuum chuck unit such that a gap between dies of the wafer widens, and a chucking module installed in the vacuum chuck unit to restrain the ring cover unit pressed by the expander module to the vacuum chuck unit.

The expander module may include an expander moving part, an expander head installed at the expander moving part, and a plurality of expander arms connected to the expander head to hold and move the ring cover unit and configured to press the ring cover unit such that the chucking module restrains the ring cover unit to the vacuum chuck unit.

When the chucking module restrains the ring cover unit to the vacuum chuck unit, the expander arm may release a press applied to the ring cover unit.

The expander head may include an expander casing connected to the expander moving part, a plurality of expander sliders coupled to the expander casing to be radially movable and each connected to one of the expander arms, an expander rod disposed inside the expander casing to move the plurality of expander sliders, and an expander driving part disposed in the expander casing to move the expander rod.

The expander casing may include a casing body having a movement space, in which the expander rod moves, formed therein, a first blocking plate configured to block one side of the casing body, and a second blocking plate which blocks the other side of the casing body and has a movement hole, into which the expander rod is movably inserted, formed therein.

The expander rod may include a moving disk portion movably installed in a movement space of the expander casing, a plunger portion connected to the moving disk portion to be inserted into a movement hole of the expander casing, and a push portion connected to the plunger portion and the expander slider to move the expander slider as the plunger portion moves.

A cone portion may be formed in the plunger portion, and the push portion may expand radially by being pressed by the cone portion.

The expander driving part may include a first supply port configured to supply a driving medium to one side of the movement space to move the moving disk portion toward the expander slider and a second supply port configured to supply the driving medium to the other side of the movement space to move the moving disk portion in a direction opposite to the expander slider.

The expander arm may include an arm member connected to the expander slider, and a catch portion disposed at the arm member to restrain the ring cover unit.

The catch portion may include a catch body connected to the arm member to surround an outer side of the ring cover unit and a catch pin coupled to the catch body to be inserted into a cover hole of the ring cover unit.

The chucking module may include a chucking base installed in the vacuum chuck unit, a chucking rotating part connected to the chucking base to rotate the chucking base, a plurality of chucking link parts which are each radially connected to the chucking base and move when the chucking base rotates, and a plurality of cover restraining parts each connected to one of the chucking link parts to restrain the ring cover unit to the vacuum chuck unit when the chucking link parts move.

The chucking base may include a base body formed in an annular shape to be concentric with a rotating shaft of the vacuum chuck unit, a plurality of guide portions formed in the base body such that the chucking link parts are movably coupled thereto, and a base gear portion formed on the base body and connected to the chucking rotating part.

The guide portion may be formed to be inclined with respect to a radial direction of the base body.

The chucking link part may include a guide slider movably coupled to the chucking base, a link member connected to the guide slider and installed to move linearly in a radial direction of the chucking base when the guide slider moves, and a link gear portion formed on the link member to move by being engaged with the cover restraining part.

The chucking link part may further include guide rollers configured to support both sides of the link member.

The cover restraining part may include a cover restraining shaft portion rotatably installed in the vacuum chuck unit, a restraining gear portion formed on the cover restraining shaft portion to be engaged with the link gear portion, a cover restraining bar connected to the cover restraining shaft portion to press and release the ring cover unit, and a restraining roller rotatably installed on the cover restraining bar to be in rolling contact with the ring cover unit According to another aspect of the present invention, there is provided a method of controlling a wafer cleaning apparatus including restraining, by an expander module, a ring cover unit, mounting a wafer on a vacuum chuck unit, pressing, by the expander module, the ring cover unit such that a gap between dies of the wafer widens, restraining, by a chucking module, the ring cover unit to the vacuum chuck unit, and spaying, by an ultrasonic cleaning module, a cleaning solution onto the wafer and applying ultrasonic waves to the cleaning solution to ultrasonically vibrate the cleaning solution.

The method may further include, after the restraining of the ring cover unit to the vacuum chuck unit, releasing, by the expander module, restraint of the ring cover unit and moving the expander module to a standby position.

The restraining of the ring cover unit may include moving, by an expander head, a plurality of expander arms of the expander module outward, allowing a catch portion of the expander arm to face the ring cover unit, and moving, by the expander head, the plurality of expander arms inward and restraining, by the catch portion, the ring cover unit.

The pressing of the ring cover unit such that the gap between the dies of the wafer widens may include pressing, by the expander arms of the expander module, a retainer ring portion of the wafer such that the gap between the dies widens.

The spaying of the cleaning solution onto the wafer and the applying of the ultrasonic waves to the cleaning solution to ultrasonically vibrate the cleaning solution may include applying, by the ultrasonic cleaning module, the ultrasonic waves in a state in which the ultrasonic cleaning module is immersed in the cleaning solution.

The spaying of the cleaning solution onto the wafer and the applying of the ultrasonic waves to the cleaning solution to ultrasonically vibrate the cleaning solution may include lifting, by a lifting arm driving part, a lifting arm, rotating, by a swing part, the lifting arm above the vacuum chuck unit, lowering, by the lifting arm driving part, the lifting arm such that a cleaning head of the ultrasonic cleaning module is immersed in the cleaning solution, and spraying, by a cleaning solution spray part, the cleaning solution onto the wafer and ultrasonically vibrating, by an ultrasonic wave generator, the cleaning solution.

The lowering of the lifting arm such that the cleaning head of the ultrasonic cleaning module is immersed in the cleaning solution may include forming, by an internal pressure forming part, pressure higher than atmospheric pressure inside the cleaning head.

The lowering of the lifting arm such that the cleaning head of the ultrasonic cleaning module is immersed in the cleaning solution may include arranging an inflow side of a lower surface of the cleaning head, into which the cleaning solution flows, at a higher level than an outflow side thereof of which the cleaning solution flows out.

In the cleaning head, a height of a lower surface of one side of the cleaning head may be adjusted according to a change in height of the wafer.

The lowering of the lifting arm such that the cleaning head of the ultrasonic cleaning module is immersed in the cleaning solution may include lowering the lifting arm such that the cleaning head maintains a preset interval from a surface of the wafer.

A spray nozzle of the cleaning solution spray part may spray the cleaning solution to be inclined with respect to a direction in which the cleaning solution flows on the wafer.

The mounting of the wafer on the vacuum chuck unit may include receiving, by a transfer unit, the wafer from a transport unit, moving the transfer unit above the vacuum chuck unit, and lowering the transfer unit such that the wafer is mounted on the vacuum chuck unit.

The method may further include discharging the cleaning solution when a cleaning time of the wafer has elapsed, and rotating the vacuum chuck unit to dry the wafer.

The method may further include moving the expander module to restrain the ring cover unit, releasing, by the chucking module, the restraining of the ring cover unit, moving the expander module to a standby position, and taking the wafer out of the vacuum chuck unit.

DETAILED DESCRIPTION OF EXEMPLARY EMBODIMENTS

Figure 1:
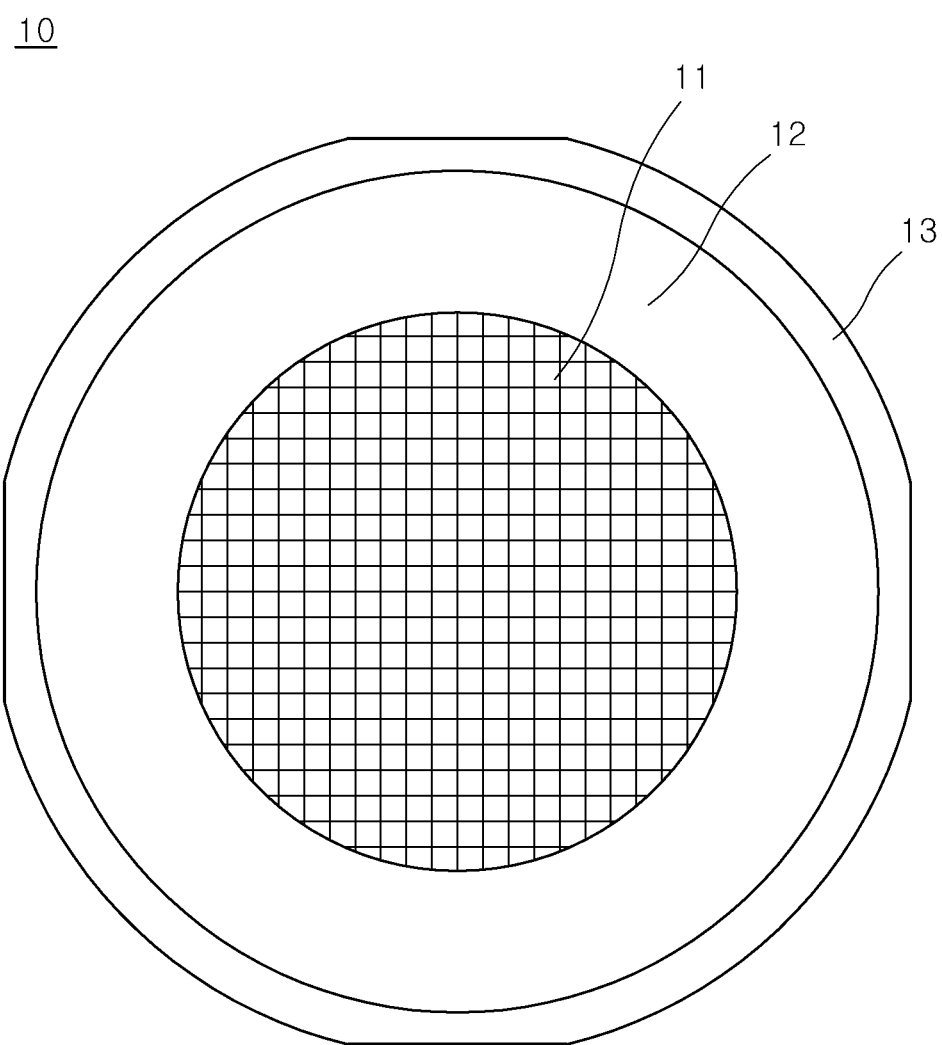
FIG. 1 is a schematic plan view illustrating a wafer to be processed in a wafer cleaning apparatus according to one embodiment of the present invention.

Hereinafter, embodiments of a wafer cleaning apparatus and a method of controlling the same according to the present invention will be described with reference to the accompanying drawings. In describing the wafer cleaning apparatus and the method of controlling the same, thickness of lines or sizes of components shown in the drawings may be exaggerated for the sake of convenience and clarity in description. Furthermore, terminologies used herein are defined by taking functions of the present invention into account and may be changed according to a custom or the intent of a user or an operator. Accordingly, the terminologies should be defined based on the following overall description of the present specification.

Figure 2:
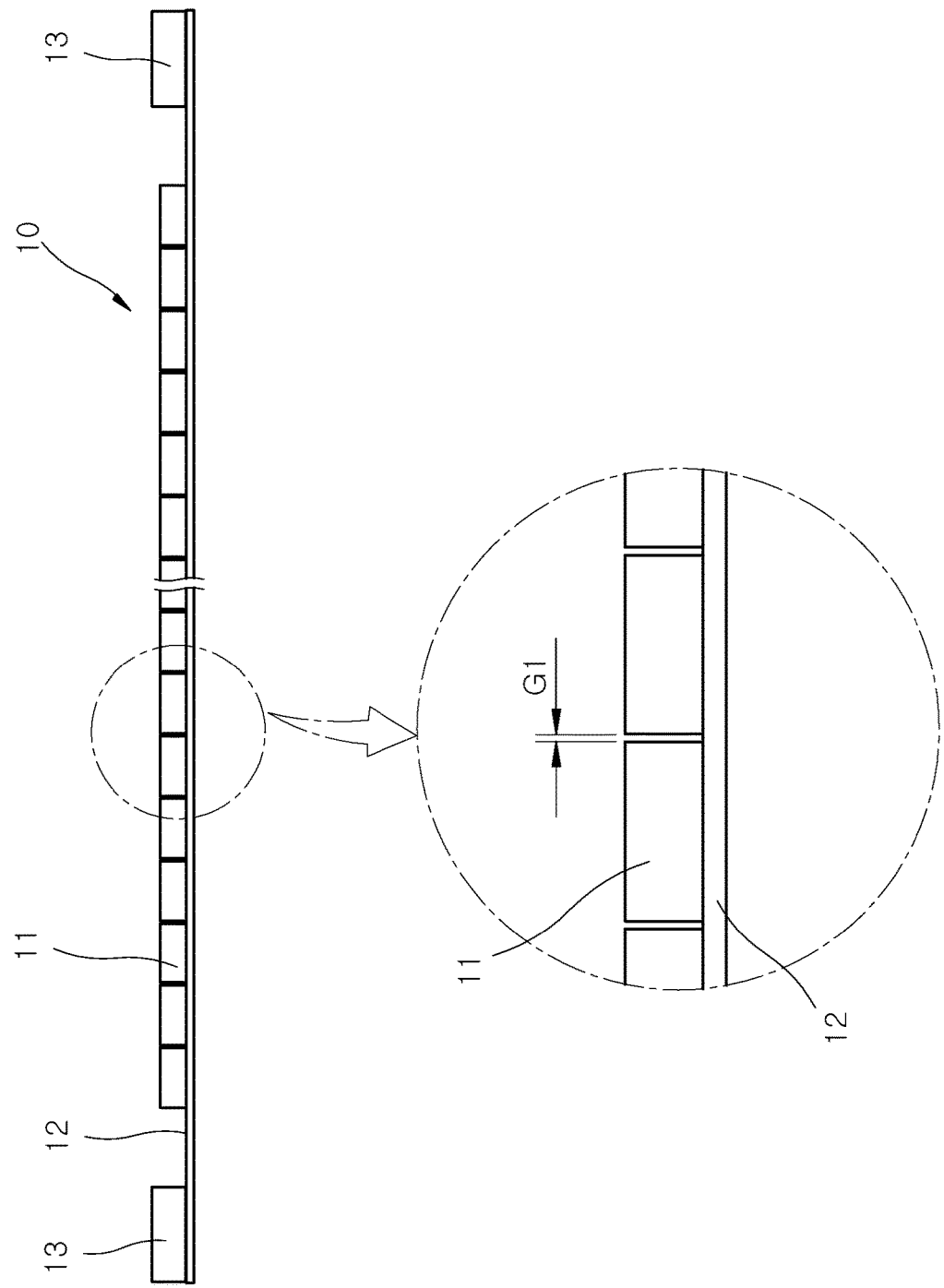
FIG. 2 shows schematic side views of the wafer to be processed in the wafer cleaning apparatus according to one embodiment of the present invention.
Figure 3:
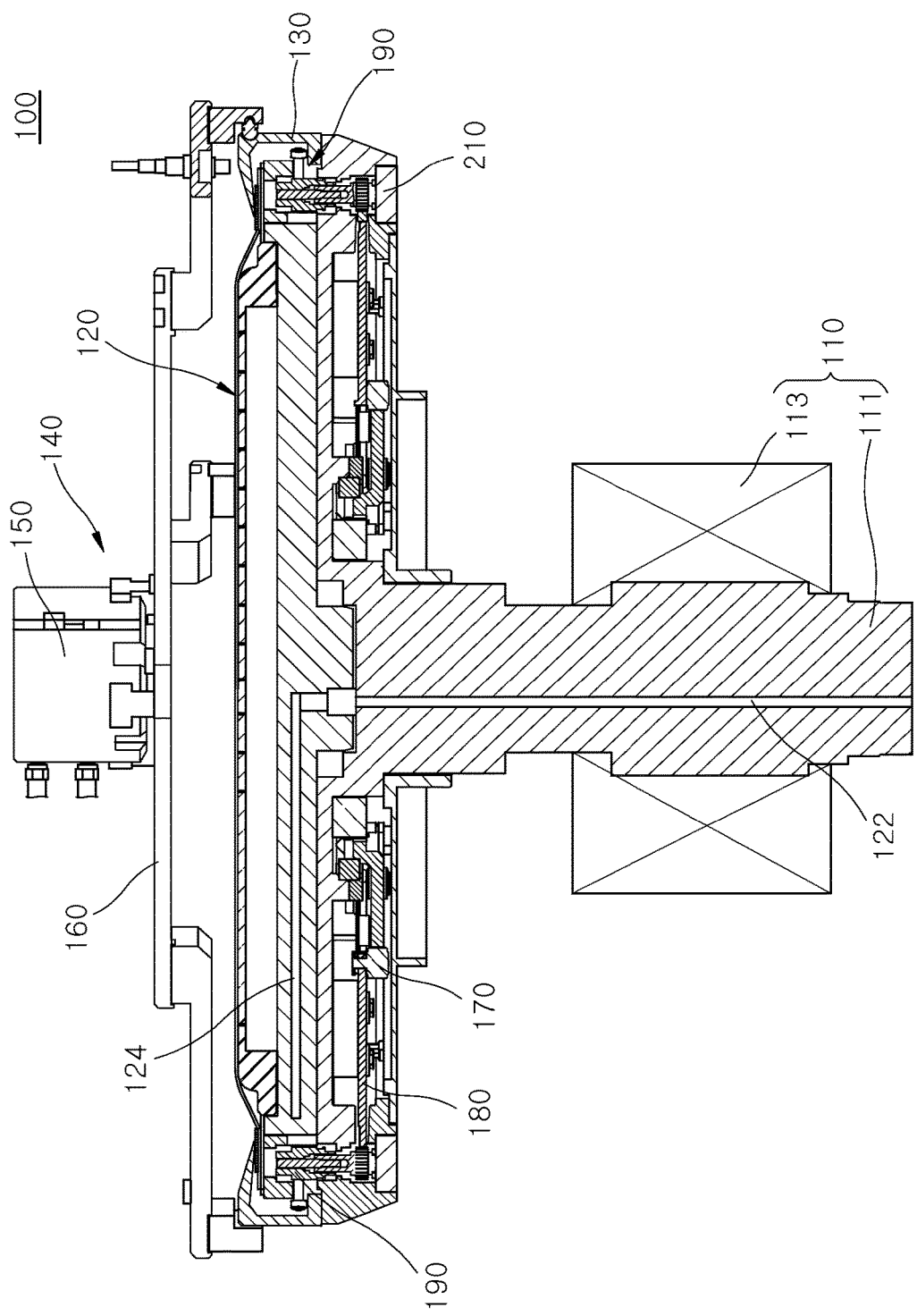
FIG. 3 is a schematic side view illustrating the wafer cleaning apparatus according to one embodiment of the present invention.
Figure 4A:
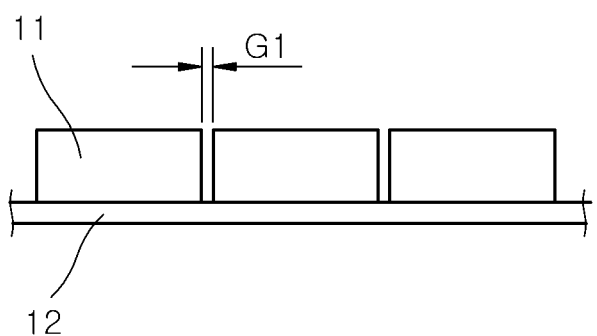
FIGS. 4A and 4B show schematic side views illustrating a state in which gaps between a plurality of dies widen as an expander module is lowered to press a ring cover unit and a retainer ring portion of the wafer in the wafer cleaning apparatus according to one embodiment of the present invention.
Figure 4B:
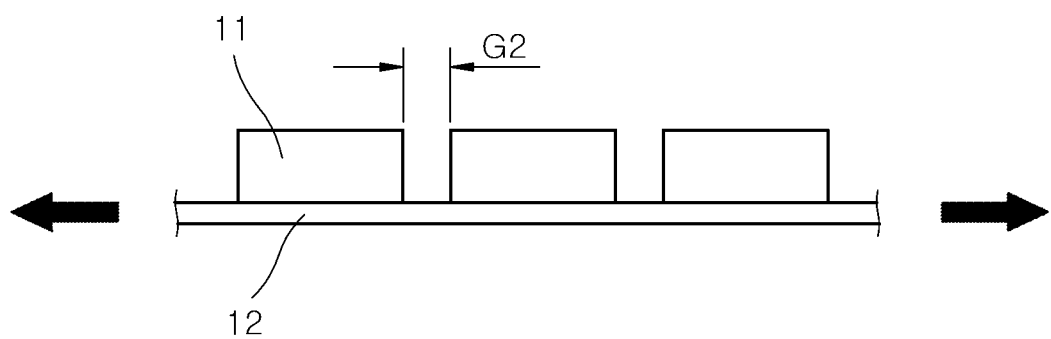

FIG. 1 is a schematic plan view illustrating a wafer to be processed in a wafer cleaning apparatus according to one embodiment of the present invention. FIG. 2 shows schematic side views of the wafer to be processed in the wafer cleaning apparatus according to one embodiment of the present invention. FIG. 3 is a schematic side view illustrating the wafer cleaning apparatus according to one embodiment of the present invention. FIGS. 4A and 4B show schematic side views illustrating a state in which gaps between a plurality of dies widen as an expander module is lowered to press a ring cover unit and a retainer ring portion of the wafer in the wafer cleaning apparatus according to one embodiment of the present invention.

Referring to FIGS. 1 to 4, a wafer cleaning apparatus 100 according to one embodiment of the present invention includes a vacuum chuck unit 120, a ring cover unit 130, an expander module 140, and a chucking module 170.

The wafer cleaning apparatus 100 cleans a wafer 10. The wafer 10 etched in an etching process is sawn in a matrix form in a singulation process to form a plurality of dies 11. In a cleaning process, a cleaning solution is sprayed onto the wafer 10 to remove foreign materials attached to the plurality of dies 11. As the cleaning solution, various types of solution such as deionized water (DIW) may be applied.

The wafer 10 includes the plurality of dies 11 arranged in the form of a matrix, an adhesive sheet 12 to which the plurality of dies 11 are attached, and a retainer ring portion 13 connected to a circumferential portion of the adhesive sheet 12 to tightly support the adhesive sheet 12. The adhesive sheet 12 is made of a material that is stretchable or contractible in a horizontal direction. The adhesive sheet 12 is pulled tight by the retainer ring portion 13 so that the plurality of dies 11 of the wafer 10 are positioned and fixed, and the die 11, which is a thin plate, maintains a flat plate shape.

A chamber unit 102 is formed inside a case 101, and a cup housing 105 is installed in the chamber unit 102. The vacuum chuck unit 120 is disposed inside the cup housing 105 in which the cleaning solution is accommodated. The cup housing 105 is installed to surround an outer side of the vacuum chuck unit 120. The cleaning solution sprayed from the cup housing 105 (see FIG. 14) may be prevented from being discharged or scattered to the outside by the cup housing 105.

The vacuum chuck unit 120 is installed to be rotatable by a driving unit 110. The entirety of the vacuum chuck unit 120 may be formed in a disk shape.

The driving unit 110 includes a rotating shaft 111 connected to a rotation center of the vacuum chuck unit 120 and a motor unit 113 installed on the rotating shaft 111. The motor unit 113 includes a stator (not shown) installed inside a housing (not shown) and a rotor (not shown) disposed inside the stator and installed to surround the rotating shaft 111. In addition, as the driving unit 110, a belt driving type for rotating the rotating shaft 111 through a belt or a chain driving type for rotating the rotating shaft 111 through a chain may be applied. As long as the driving unit 110 rotates the vacuum chuck unit 120, various forms may be applied.

A vacuum flow path 122 is formed in the rotating shaft 111 to vacuumize the vacuum chuck unit 120. The vacuum flow path 122 is formed in a length direction of the rotating shaft 111. A vacuum chamber 124 is formed in the vacuum chuck unit 120 to be connected to the vacuum flow path 122. A plurality of vacuum holes (not shown) are formed in the vacuum chuck unit 120 to apply vacuum pressure to the wafer 10. The vacuum chuck unit 120 may be formed in various ways.

The wafer 10 is mounted on the vacuum chuck unit 120. The wafer 10 in a state in which the plurality of dies 11 are sawn is mounted on the vacuum chuck unit 120. When the wafer 10 is sawn into the dies 11, foreign materials may remain on surfaces of the dies 11 and in the gaps between the dies 11.

The ring cover unit 130 faces the retainer ring portion 13 of the wafer 10. The ring cover unit 130 includes a cover body 131 formed to surround a circumferential portion of the vacuum chuck unit 120, a restraining stepped portion 132 formed to protrude inward from a lower side of the cover body 131, and a cover pressing portion 133 which extends inward from an upper side of the cover body 131 and presses the retainer ring portion 13 of the wafer 10. The cover pressing portion 133 may be formed such that a thickness thereof is gradually decreased toward an end thereof. Since the cover pressing portion 133 seals an upper surface of the retainer ring portion 13, the cleaning solution can be prevented from permeating into parts outside the retainer ring portion 13.

The expander module 140 is installed to move the ring cover unit 130 and presses the retainer ring portion 13 toward the vacuum chuck unit 120 to widen the gaps between the dies 11 in the wafer 10.

The chucking module 170 is installed in the vacuum chuck unit 120 to fix the retainer ring portion 13 of the wafer 10 to the vacuum chuck unit 120. The chucking module 170 presses the retainer ring portion 13 downward to fix the retainer ring portion 13 to the circumferential portion of the vacuum chuck unit 120. Therefore, when the vacuum chuck unit 120 rotates, the chucking module 170 presses the ring cover unit 130 and the retainer ring portion 13 to prevent a position change of the wafer 10 and allow the wafer 10 to maintain a flat state. The chucking module 170 will be described in detail below.

Figure 5:
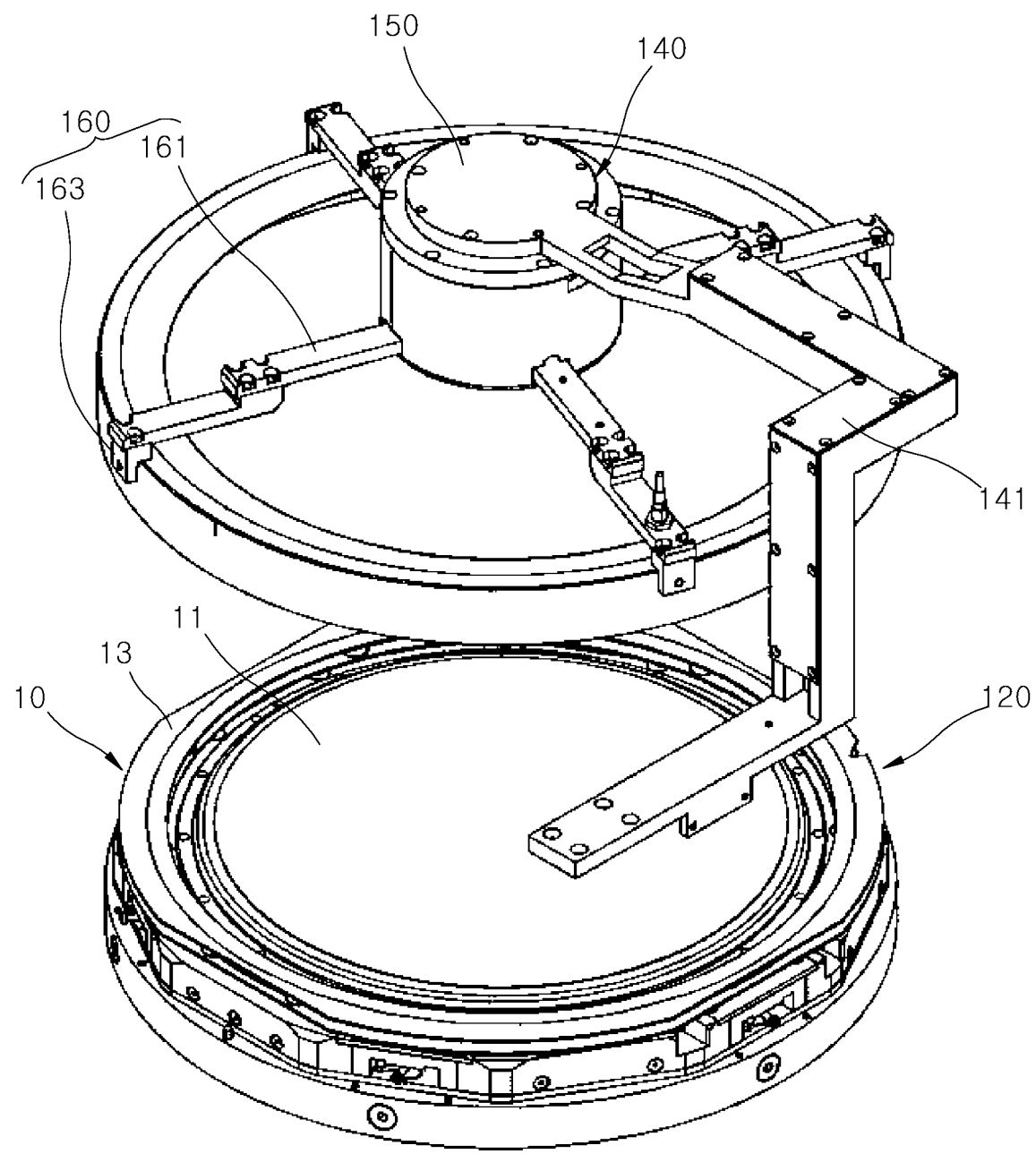
FIG. 5 is a schematic perspective view illustrating a state in which the expander module holds and moves the ring cover unit in the wafer cleaning apparatus according to one embodiment of the present invention.
Figure 6:
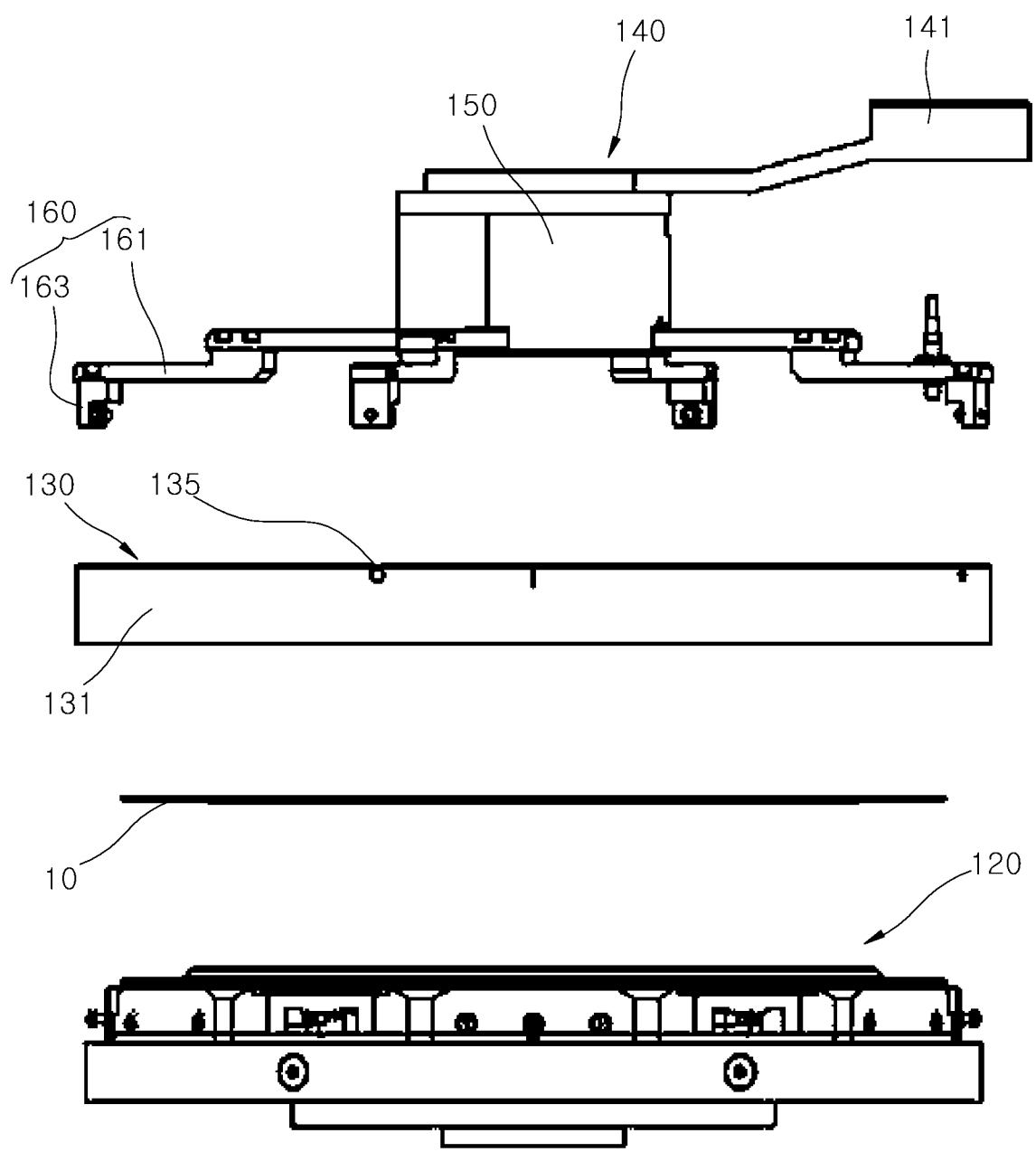
FIG. 6 shows schematic side views illustrating the expander module, the ring cover unit, and a vacuum chuck unit in the wafer cleaning apparatus according to one embodiment of the present invention.
Figure 7:
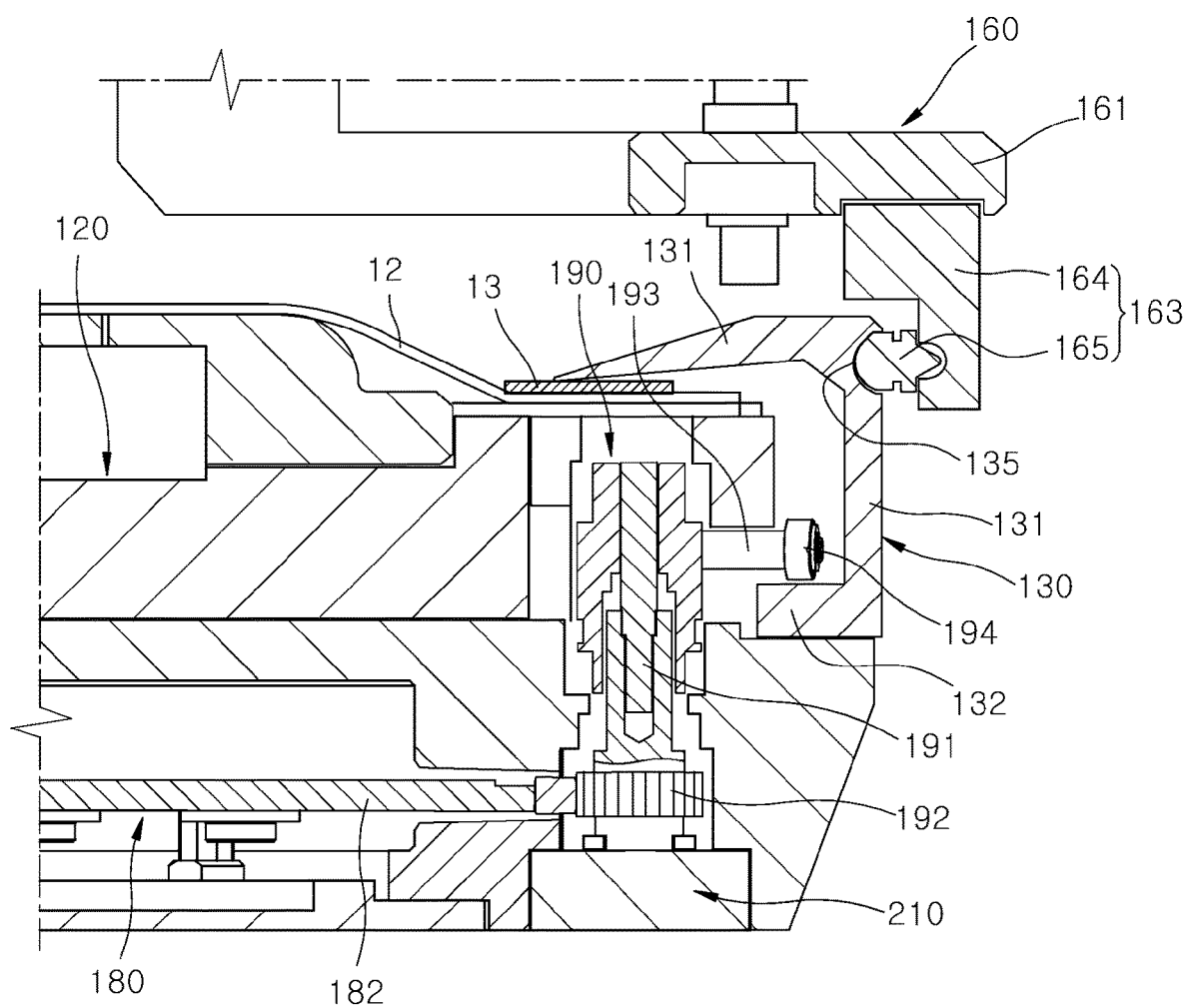
FIG. 7 is a schematic cross-sectional view illustrating a state in which a chucking module restrains the ring cover unit in the wafer cleaning apparatus according to one embodiment of the present invention.
Figure 8:
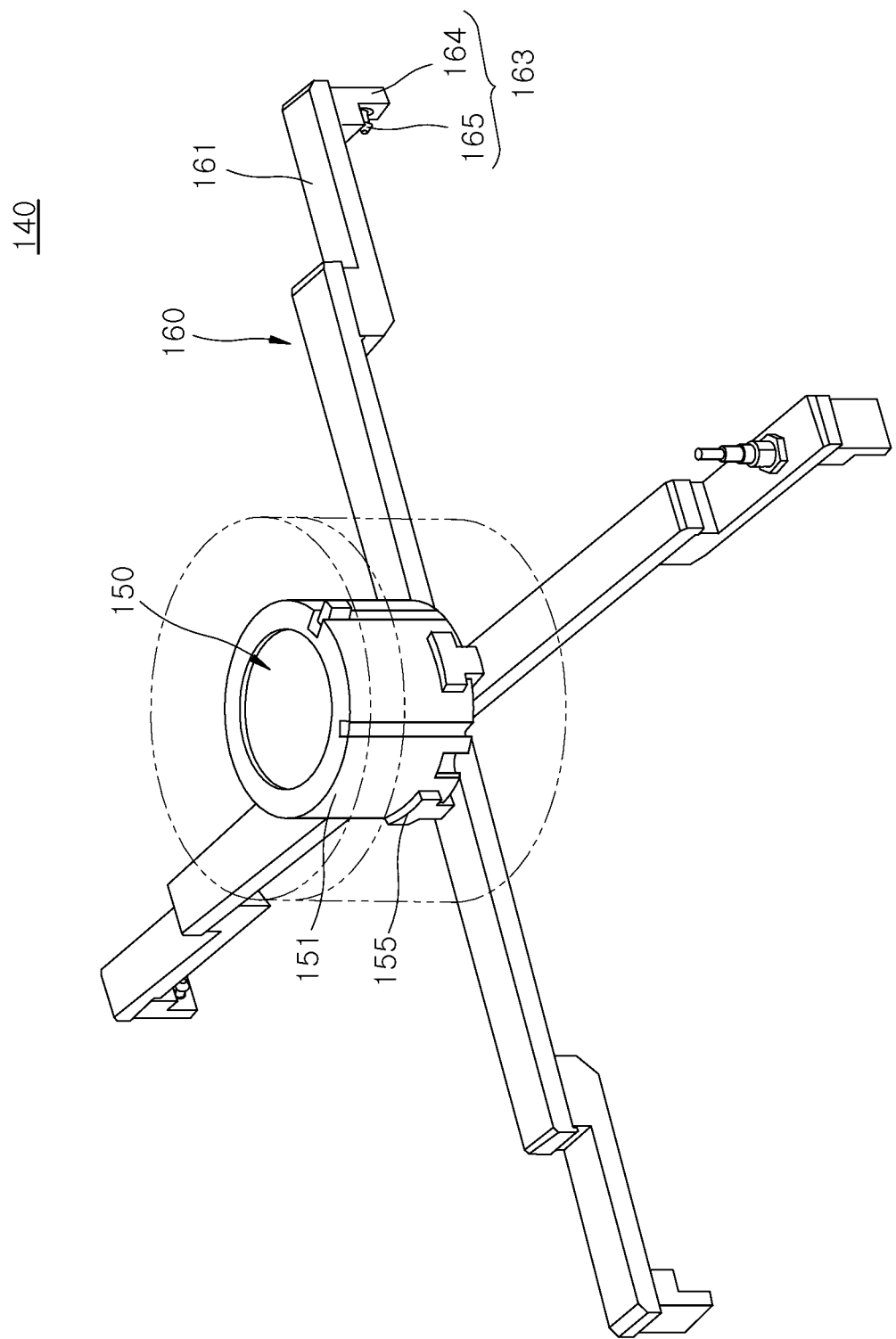
FIG. 8 is a schematic perspective view illustrating the expander module in the wafer cleaning apparatus according to one embodiment of the present invention.
Figure 9:
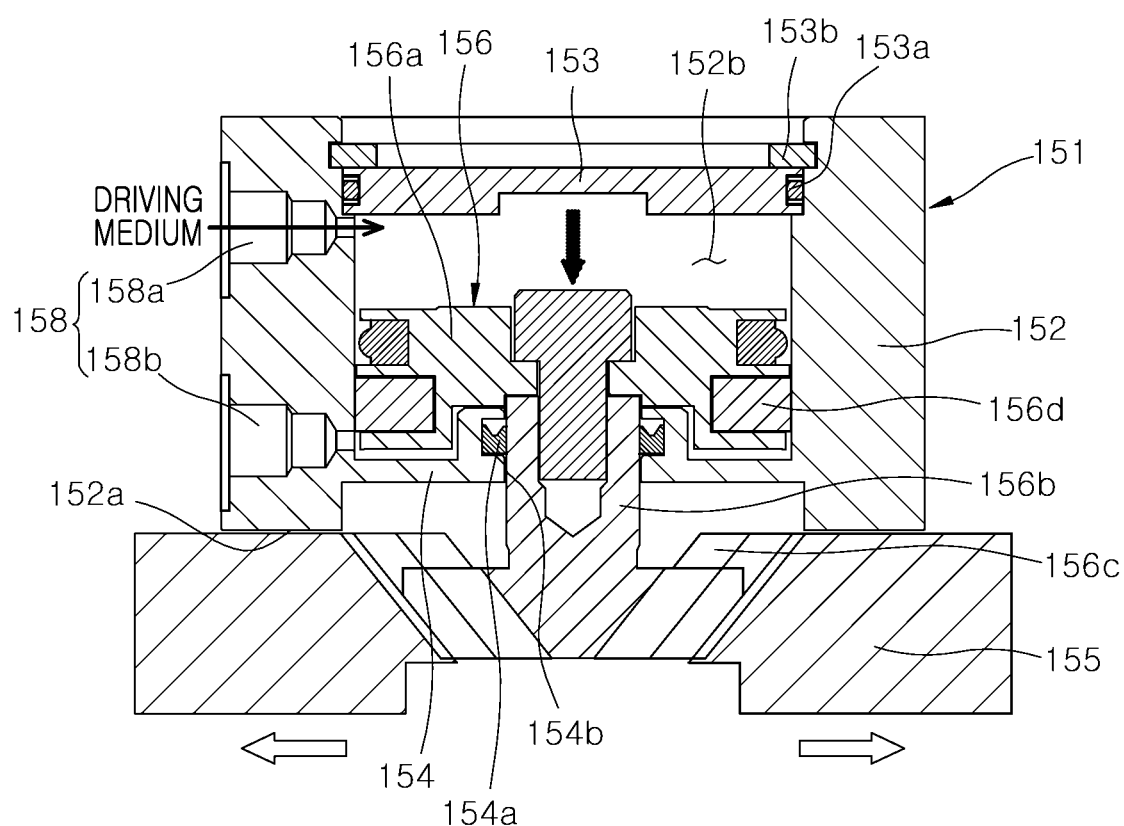
FIG. 9 is a schematic cross-sectional view illustrating an expander head of the expander module in the wafer cleaning apparatus according to one embodiment of the present invention.
Figure 10:
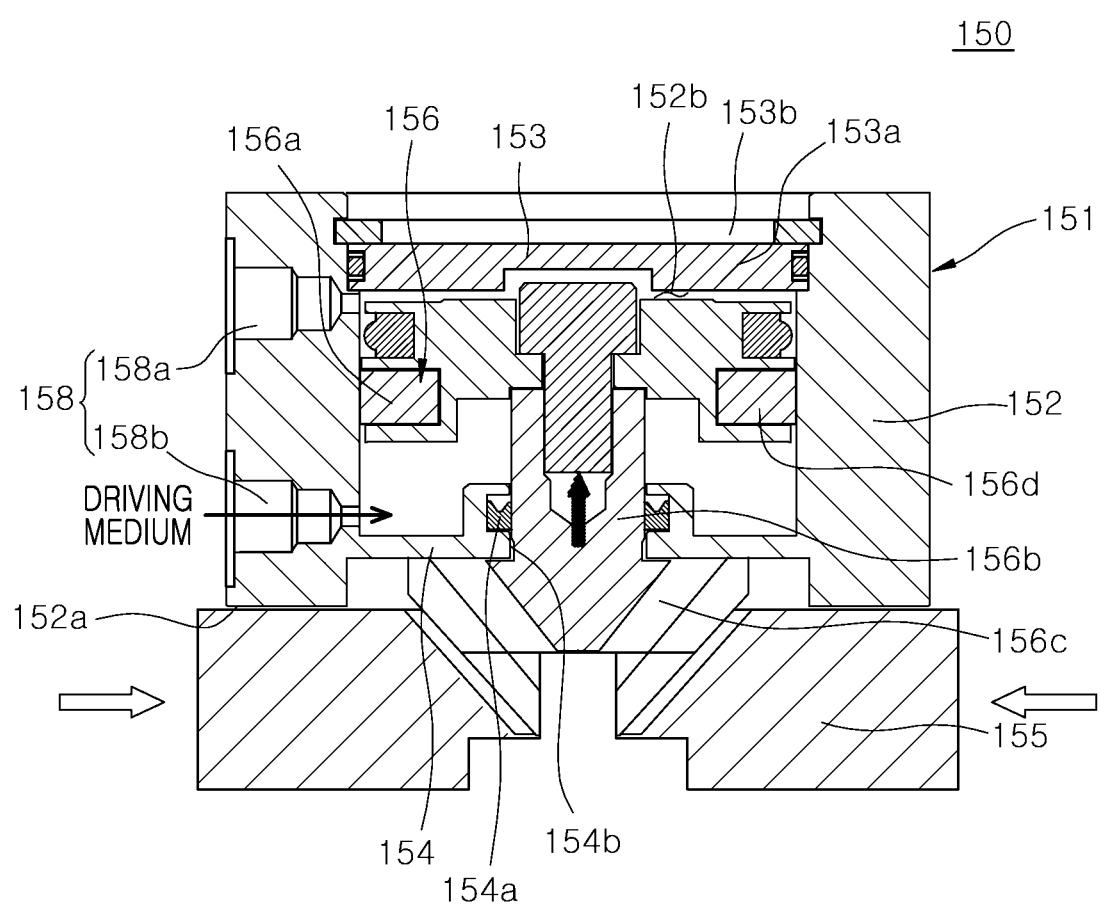
FIG. 10 is a schematic cross-sectional view illustrating a state in which an expander slider moves into the expander head in the expander module of the wafer cleaning apparatus according to one embodiment of the present invention.

FIG. 5 is a schematic perspective view illustrating a state in which the expander module holds and moves the ring cover unit in the wafer cleaning apparatus according to one embodiment of the present invention. FIG. 6 shows schematic side views illustrating the expander module, the ring cover unit, and the vacuum chuck unit in the wafer cleaning apparatus according to one embodiment of the present invention. FIG. 7 is a schematic cross-sectional view illustrating a state in which the chucking module restrains the ring cover unit in the wafer cleaning apparatus according to one embodiment of the present invention. FIG. 8 is a schematic perspective view illustrating the expander module in the wafer cleaning apparatus according to one embodiment of the present invention. FIG. 9 is a schematic cross-sectional view illustrating an expander head of the expander module in the wafer cleaning apparatus according to one embodiment of the present invention. FIG. 10 is a schematic cross-sectional view illustrating a state in which an expander slider moves into the expander head in the expander module of the wafer cleaning apparatus according to one embodiment of the present invention.

Referring to FIGS. 5 to 10, the expander module 140 includes an expander moving part 141, an expander head 150, and a plurality of expander arms 160.

The expander moving part 141 is installed above the vacuum chuck unit 120 to be vertically movable. As long as the expander moving part 141 is installed to be vertically movable, various forms such as a robot arm form and a ball screw form may be applied. The expander head 150 is installed to be movable by the expander moving part 141. The plurality of expander arms 160 are connected to the expander head 150 to hold and move the ring cover unit 130, and the chucking module 170 presses the ring cover unit 130 to restrain the ring cover unit 130 to the vacuum chuck unit 120. The plurality of expander arms 160 are disposed radially from the expander head 150. Four or more expander arms 160 may be installed at a circumferential portion of the expander head 150.

In a state in which the plurality of expander arms 160 press the ring cover unit 130, since the chucking module 170 restrains the ring cover unit 130 to the vacuum chuck unit 120, the retainer ring portion 13 of the wafer 10 moves downward by the ring cover unit 130. In this case, as the ring cover unit 130 is lowered, the adhesive sheet 12 of the wafer 10 is pulled in a radial direction and thus is stretched in the radial direction. As the adhesive sheet 12 is stretched in the radial direction, the gaps between the plurality of dies 11 widen (see FIGS. 4A and 4B). In a state in which the gaps between the plurality of dies 11 widen, when a cleaning solution is sprayed onto the plurality of dies 11, foreign materials attached to the surfaces of the dies 11 as well as foreign materials positioned in the gaps between the plurality of dies 11 can be easily removed by the cleaning solution. Accordingly, cleaning performance with respect to foreign materials on the wafer 10 can be considerably improved. In addition, cleaning performance with respect to the wafer 10 is considerably improved, thereby considerably reducing a defect rate of the wafer 10.

In addition, when the chucking module 170 restrains the ring cover unit 130 to the vacuum chuck unit 120, the expander arm 160 releases the press applied to the ring cover unit 130. The expander moving part 141 moves the expander head 150 and the expander arm 160 above the vacuum chuck unit 120. Accordingly, when an ultrasonic cleaning module 220 moves above the wafer 10, the ultrasonic cleaning module 220 can be prevented from colliding with or being interfered with by the expander module 140.

The expander head 150 includes an expander casing 151, a plurality of expander sliders 155, an expander rod 156, and an expander driving part 158.

The expander casing 151 is connected to the expander moving part 141. The entirety of the expander casing 151 may be formed in a cylindrical shape. The plurality of expander sliders 155 are coupled to the expander casing 151 to be radially movable and are each connected to one of the expander arms 160. In this case, slider grooves 152a are radially formed at a circumferential portion of the expander casing 151 such that the expander sliders 155 are movably coupled thereto. The expander rod 156 is disposed inside the expander casing 151 to move the plurality of expander sliders 155. The expander rod 156 is installed inside the expander casing 151 to be vertically movable. The expander driving part 158 is disposed in the expander casing 151 to move the expander rod 156.

When the expander driving part 158 is driven, as the expander rod 156 moves, the expander sliders 155 move radially with respect to the expander casing 151. As the expander slider 155 moves outward from the expander casing 151, the expander arm 160 moves outward to release the restraint of the ring cover unit 130, and as the expander slider 155 moves into the expander casing 151, the expander arm 160 moves inward to restrain the ring cover unit 130.

The expander casing 151 includes a casing body 152, a first blocking plate 153, and a second blocking plate 154.

A movement space 152b is formed in the casing body 152 such that the expander rod 156 moves therein. The movement space 152b may be formed in a cylindrical shape. The first blocking plate 153 is installed to block one side of the casing body 152. The first blocking plate 153 is detachably installed at an upper side of the casing body 152. A first sealing member 153a is installed at a circumferential portion of the first blocking plate 153. A snap ring portion 153b is installed at one side of the first blocking plate 153 to prevent the first blocking plate 153 from being separated from the casing body 152. After the expander rod 156 is inserted into the movement space 152b, the first blocking plate 153 is installed to block one side of the casing body 152. The second blocking plate 154 blocks the other side of the casing body 152, and a movement hole 154b is formed therein such that the expander rod 156 is movably inserted. A second sealing member 154a is installed at a circumferential portion of the movement hole 154b to seal a gap with the expander rod 156. The expander rod 156 is installed to be vertically movable.

The expander rod 156 includes a moving disk portion 156a, a plunger portion 156b, and a push portion 156c.

The moving disk portion 156a is movably installed in the movement space 152b. A disk sealing member 156d is installed at a circumferential portion of the moving disk portion 156a to seal a gap between an inner surface of the expander casing 151 and an outer surface of the moving disk portion 156a. The moving disk portion 156a is formed in a disk shape. The plunger portion 156b is connected to the moving disk portion 156a to be inserted into the movement hole 154b. The plunger portion 156b is coupled to a central portion of the moving disk portion 156a. The push portion 156c is connected to the plunger portion 156b and the expander slider 155 to move the expander slider 155 as the plunger portion 156b moves. As the push portion 156c is lowered to press the expander slider 155, the expander slider 155 moves outward, and as the push portion 156c is lifted to release the press applied to the expander slider 155, the expander slider 155 moves inward.

A cone portion (not shown) is formed in the plunger portion 156b, and the push portion 156c expands radially by being pressed by the cone portion. In addition, as the cone portion releases the press applied to the push portion 156c, the push portion 156c is radially contracted by a restoring force. The push portion 156c may be formed to have a structure in which a plurality of push pieces (not shown) are connected through a spring (not shown) to be expandable and contractible or may be made of a stretchable or contractible material.

The expander driving part 158 includes a first supply port 158a for supplying a driving medium to one side of the movement space 152b to move the moving disk portion 156a toward the expander slider 155 and a second supply port 158b for supplying a driving medium to the other side of the movement space 152b to move the moving disk portion 156a in a direction opposite to the expander slider 155. A first supply line is connected to the first supply port 158a, and a second supply line is connected to the second supply port 158b. When the first supply port 158a supplies the driving medium to one side of the movement space 152b, the second supply port 158b discharges the driving medium from the other side of the movement space 152b, and when the second supply port 158b supplies the driving medium to the other side of the movement space 152b, the first supply port 158a discharges the driving medium from one side of the movement space 152b. Accordingly, when the driving medium is supplied to the first supply port 158a or the second supply port 158b, since the moving disk portion 56a moves to one side or the other side of the movement space 152b, the expander arm 160 may move radially with respect to the casing body 152.

The expander arm 160 includes an arm member 161 connected to the expander slider 155 and a catch portion 163 disposed at the arm member 161 to restrain the ring cover unit 130. The arm member 161 is disposed radially from the casing body 152. The catch portion 163 is disposed at an end portion of the arm member 161. When the expander slider 155 moves into the casing body 152, the catch portion 163 restrains the ring cover unit 130.

The catch portion 163 includes a catch body 164 connected to the arm member 161 to surround an outer side of the ring cover unit 130 and a catch pin 165 coupled to the catch body 164 to be inserted into a cover hole 135 of the ring cover unit 130. The catch body 164 may be formed in an approximately "]" shape to be in contact with an outer corner of the ring cover unit 130. The catch pin 165 is formed to protrude inward toward the catch body 164. As the arm member 161 moves inward by the expander slider 155, since the catch pin 165 is inserted into the cover hole 135 of the ring cover unit 130, the ring cover unit 130 can be prevented from being separated from the expander module 140 when the expander module 140 moves.

Figure 11:
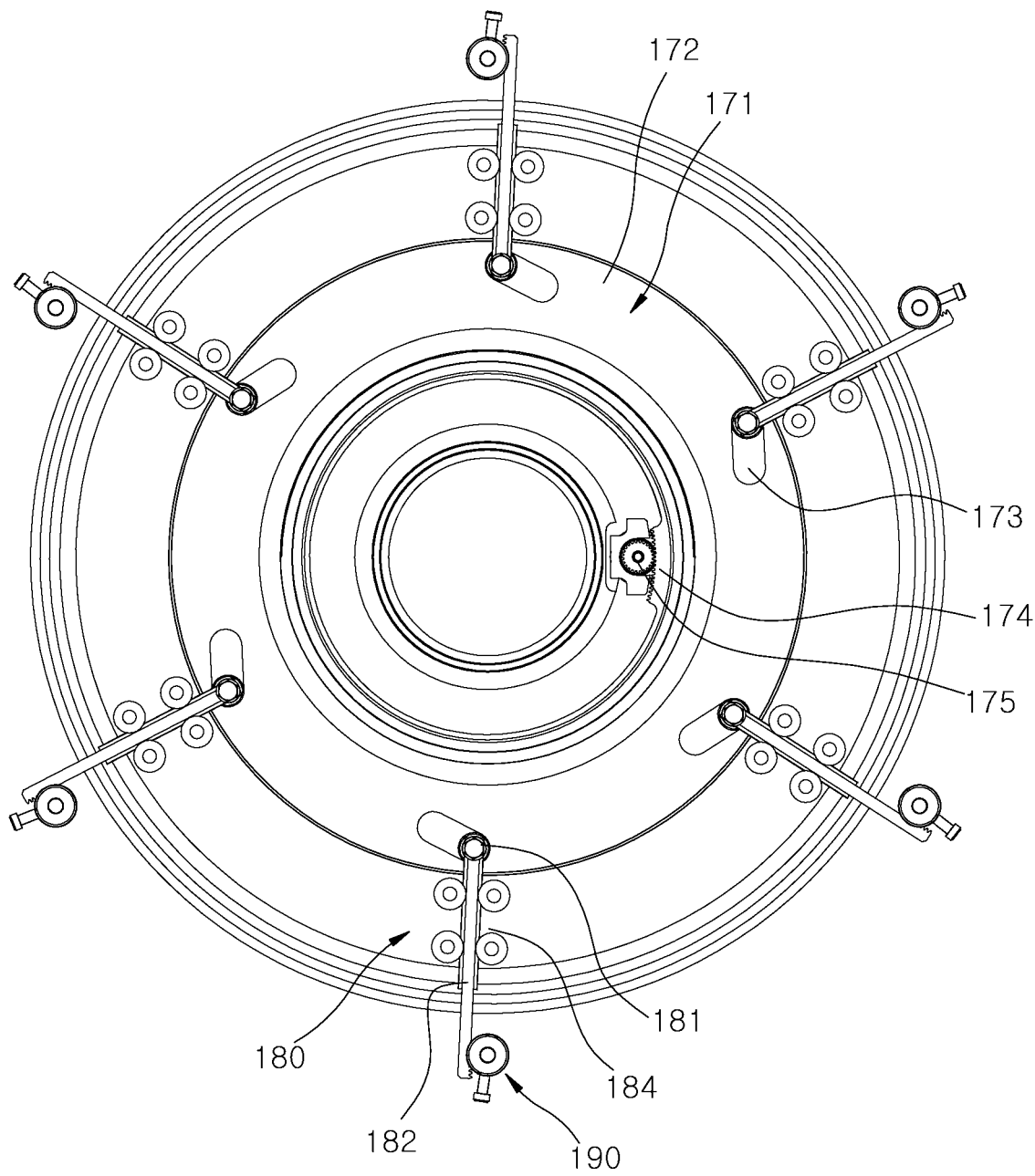
FIG. 11 is a schematic plan view illustrating the chucking module in the wafer cleaning apparatus according to one embodiment of the present invention.
Figure 12:
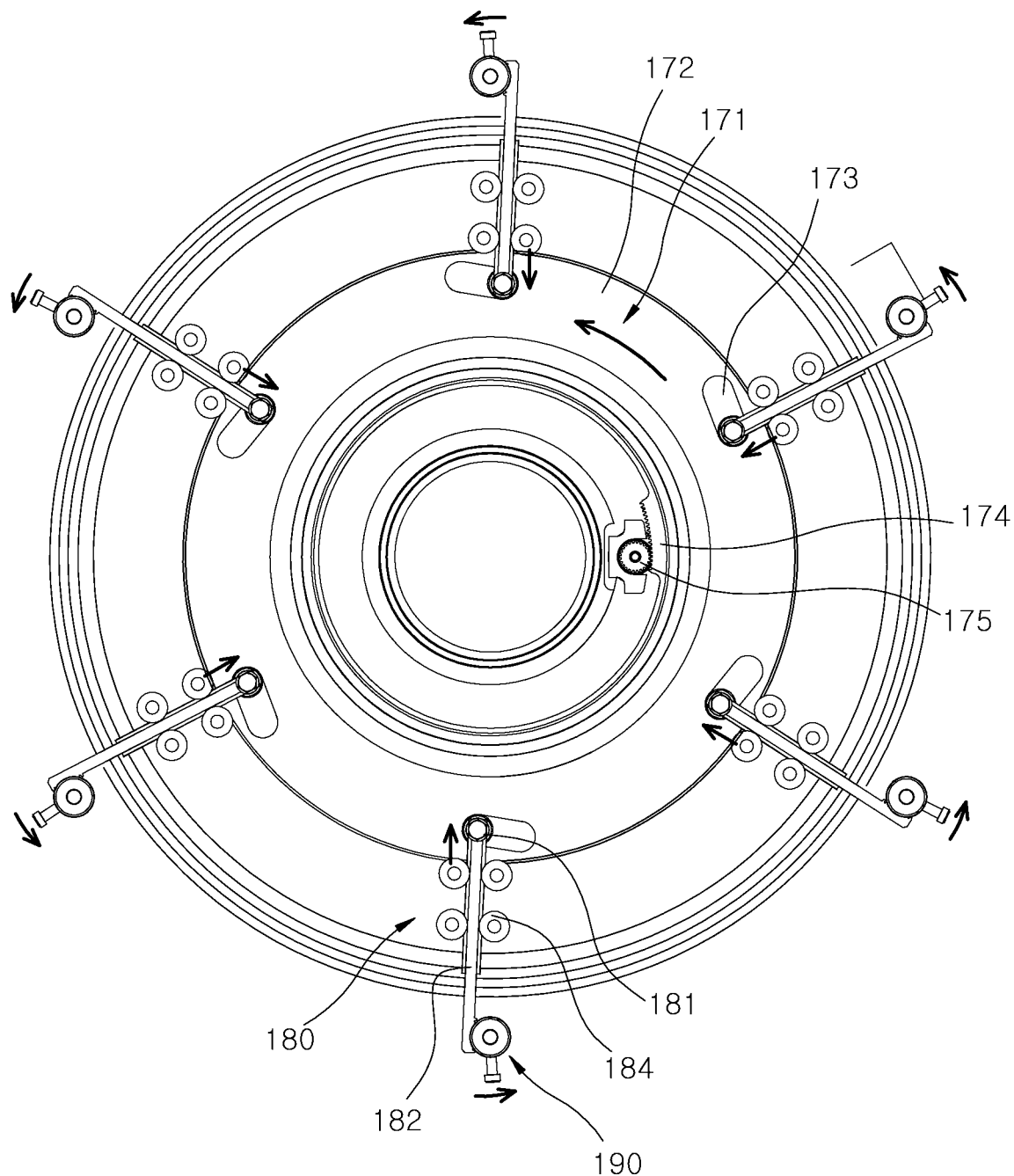
FIG. 12 is a schematic plan view illustrating a state in which, as a chucking base of the chucking module is rotated, a chucking link part is driven in the wafer cleaning apparatus according to one embodiment of the present invention.
Figure 13:
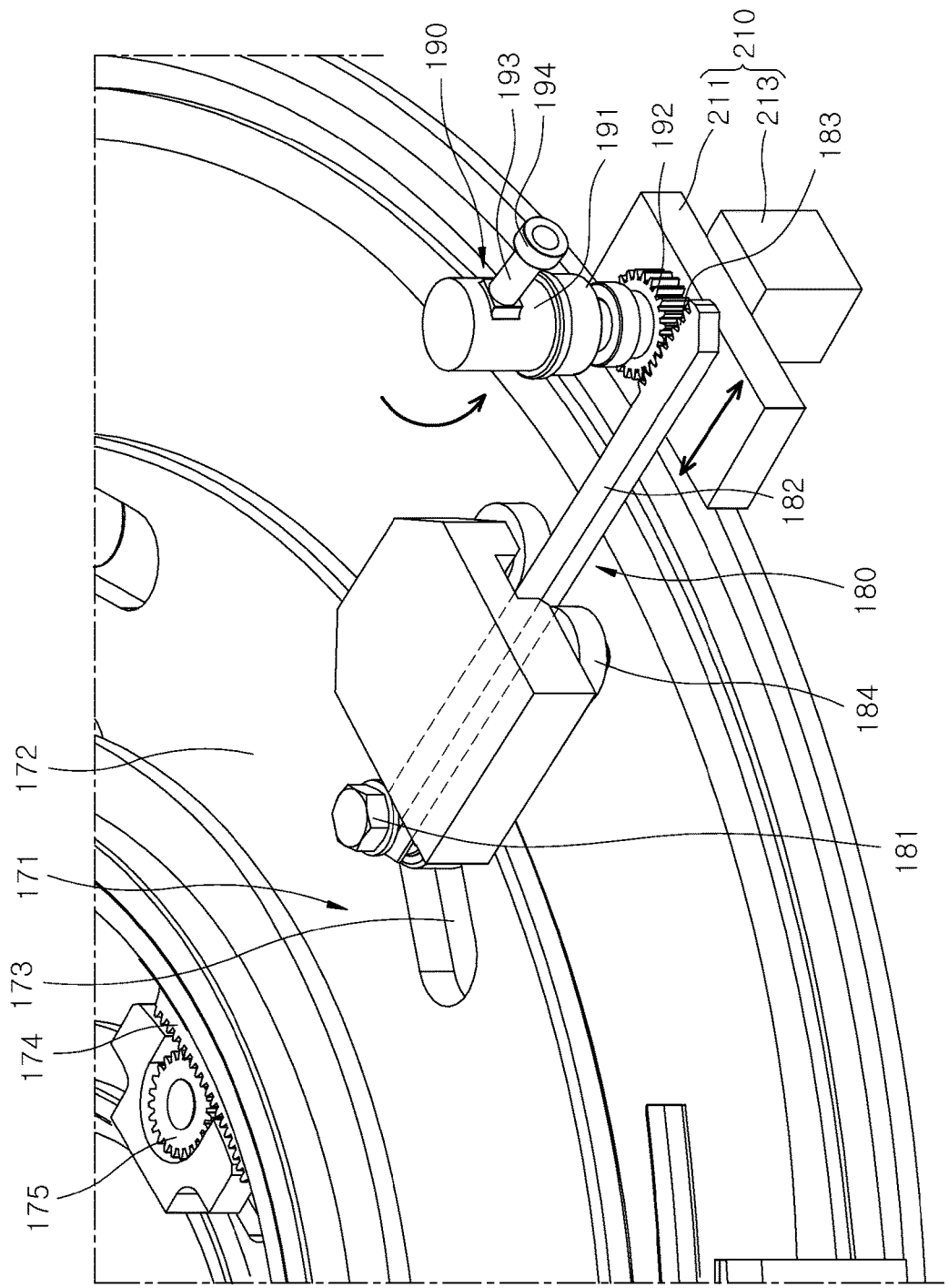
FIG. 13 is a schematic perspective view illustrating a state in which a cover restraining part of the chucking module is driven to restrain the ring cover unit in the wafer cleaning apparatus according to one embodiment of the present invention.

FIG. 11 is a schematic plan view illustrating the chucking module in the wafer cleaning apparatus according to one embodiment of the present invention. FIG. 12 is a schematic plan view illustrating a state in which, as a chucking base of the chucking module is rotated, a chucking link part is driven in the wafer cleaning apparatus according to one embodiment of the present invention. FIG. 13 is a schematic perspective view illustrating a state in which a cover restraining part of the chucking module is driven to restrain the ring cover unit in the wafer cleaning apparatus according to one embodiment of the present invention.

Referring to FIGS. 11 to 13, the chucking module 170 includes a chucking base 171, a chucking rotating part 175, a plurality of chucking link parts 180, and a plurality of cover restraining parts 190.

The chucking base 171 is installed in the vacuum chuck unit 120. The chucking rotating part 175 is connected to the chucking base 171 to rotate the chucking base 171. The plurality of chucking link parts 180 are radially connected to the chucking base 171 and move when the chucking base 171 rotates. The plurality of cover restraining parts 190 are each connected to one of the chucking link parts 180 to fix the ring cover unit 130 to the vacuum chuck unit 120 when the chucking link parts 180 move.

As the chucking rotating part 175 is driven, a base gear portion 174 is rotated, and as a base body 172 is rotated together with the base gear portion 174, the chucking link part 180 moves in a radial direction of the base body 172. In this case, when the base body 172 of the chucking base 171 rotates, the plurality of chucking link parts 180 simultaneously move, and as the chucking link parts 180 move, the ring cover unit 130 is fixed to the vacuum chuck unit 120. Therefore, since the wafer 10 and the ring cover unit 130 are simultaneously fixed to the vacuum chuck unit 120 using one chucking base 171 and one chucking rotating part 175, the structure of the wafer cleaning apparatus 100 can be implemented more simply.

The chucking base 171 includes the base body 172, a plurality of guide portions 173, and the base gear portion 174.

The base body 172 is formed in an annular shape to be concentric with the rotating shaft 111 of the vacuum chuck unit 120. The base body 172 is disposed inside the vacuum chuck unit 120. The plurality of guide portions 173 are formed in the base body 172 such that the chucking link parts 180 are movably coupled thereto. The number of the plurality of guide portions 173 is the same as the number of the chucking link parts 180, and the plurality of guide portions 173 are formed at equal intervals in a circumferential direction of the base body 172. The base gear portion 174 is formed on the base body 172 and connected to the chucking rotating part 175. The base gear portion 174 is disposed in a circular arc shape on an inner circumferential surface of the base body 172. As the chucking rotating part 175 is driven, the base gear portion 174 is rotated, and as the base body 172 is rotated together with the base gear portion 174, the chucking link part 180 moves in the radial direction of the base body 172.

The guide portion 173 is formed to be inclined with respect to the radial direction of the base body 172. The guide portion 173 may be a guide hole. The guide portion 173 may be a guide groove or a guide protrusion. Since the guide portion 173 is formed to be inclined with respect to the radial direction of the base body 172, as the base body 172 is rotated at a certain angle, the chucking link part 180 moves linearly in the radial direction of the base body 172.

The chucking link part 180 includes a guide slider 181, a link member 182, and a link gear portion 183.

The guide slider 181 is movably coupled to the guide portion 173. The link member 182 is connected to the guide slider 181 and moves linearly in the radial direction of the base body 172 when the guide slider 181 moves. The link gear portion 183 is formed on the link member 182 to move by being engaged with the cover restraining part 190. The link member 182 is formed in a straight bar shape. The link gear portion 183 is formed in the form of a rack gear parallel to a length direction of the link member 182.

The chucking link part 180 further includes guide rollers 184 for supporting both sides of the link member 182. The guide roller 184 prevents the chucking link part 180 from being rotated in the circumferential direction of the base body 172 when the base body 172 is rotated. Accordingly, when the guide slider 181 moves along the guide roller 184 when the base body 172 rotates, the link member 182 may move lineally without rotating.

The cover restraining part 190 includes a cover restraining shaft portion 191 which is rotatably installed in the vacuum chuck unit 120, a restraining gear portion 192 formed on the cover restraining shaft portion 191 to be engaged with the link gear portion 183, a cover restraining bar 193 connected to the cover restraining shaft portion 191 to press and release the ring cover unit 130, and a restraining roller 194 rotatably installed on the cover restraining bar 193 to be in rolling contact with the ring cover unit 130.

As the link member 182 moves linearly, the link gear portion 183 and the restraining gear portion 192 are driven by being engaged with each other. As the restraining gear portion 192 is rotated, the cover restraining shaft portion 191 and the cover restraining bar 193 are rotated, and the restraining roller 194 moves in rolling contact with the restraining stepped portion 132 of the ring cover unit 130. Therefore, since the restraining roller 194 is in rolling contact with the restraining stepped portion 132 of the ring cover unit 130, foreign materials can be prevented from being generated due to a scratch or abrasion of the restraining stepped portion 132 of the ring cover unit 130. Accordingly, foreign materials are suppressed from being introduced into the wafer 10 positioned inside the ring cover unit 130, thereby reducing a defect rate of the wafer 10.

The wafer cleaning apparatus 100 further includes a height adjustment module 210 installed in the vacuum chuck unit 120 to adjust an installation height of the cover restraining part 190. Before a cleaning process is started, the height adjustment module 210 is operated to adjust the installation height of the cover restraining part 190.

When the installation height of the cover restraining part 190 is adjusted by a height adjustment part 213, a height between an upper surface of the ring cover unit 130 and an upper surface of the vacuum chuck unit 120 is adjusted. As the installation height of the cover restraining part 190 is adjusted, a height of the restraining roller 194 of the cover restraining part 190 is adjusted. In this case, in a state in which the ring cover unit 130 presses the retainer ring portion 13, when the ring cover unit 130 is restrained by the cover restraining part 190, a degree of stretching of the adhesive sheet 12 of the wafer 10 is adjusted according to a restrained height of the retainer ring portion 13. For example, as the installation height of the cover restraining part 190 is decreased, the adhesive sheet 12 is more stretched, and as the installation height of the cover restraining part 190 is increased, the adhesive sheet 12 is less stretched. As the degree of stretching of the adhesive sheet 12 is adjusted, the gaps between the plurality of dies 11 may be adjusted.

The height adjustment module 210 includes an adjustment member 211 on which the cover restraining part 190 is installed and which is movably coupled to the circumferential portion of the vacuum chuck unit 120 and the height adjustment part 213 which is connected to the adjustment member 211 to adjust an installation height of the adjustment member 211. The adjustment member 211 may be formed in a block shape that is disposed at the circumferential portion of the vacuum chuck unit 120 to be vertically movable. As the height adjustment part 213, various forms such as a cylinder or a ball screw for adjusting a height of the adjustment member 211 may be applied. The height adjustment module 210 may adjust a height of the cover restraining part 190 such that a height difference between the upper surface of the vacuum chuck unit 120 and the upper surface of the retainer ring portion 13 is formed in a range of approximately 5 mm to 15 mm. The installation height of the cover restraining part 190 may be appropriately adjusted in consideration of the size of the wafer 10 and the cleaning speed of the wafer 10.

Figure 14:
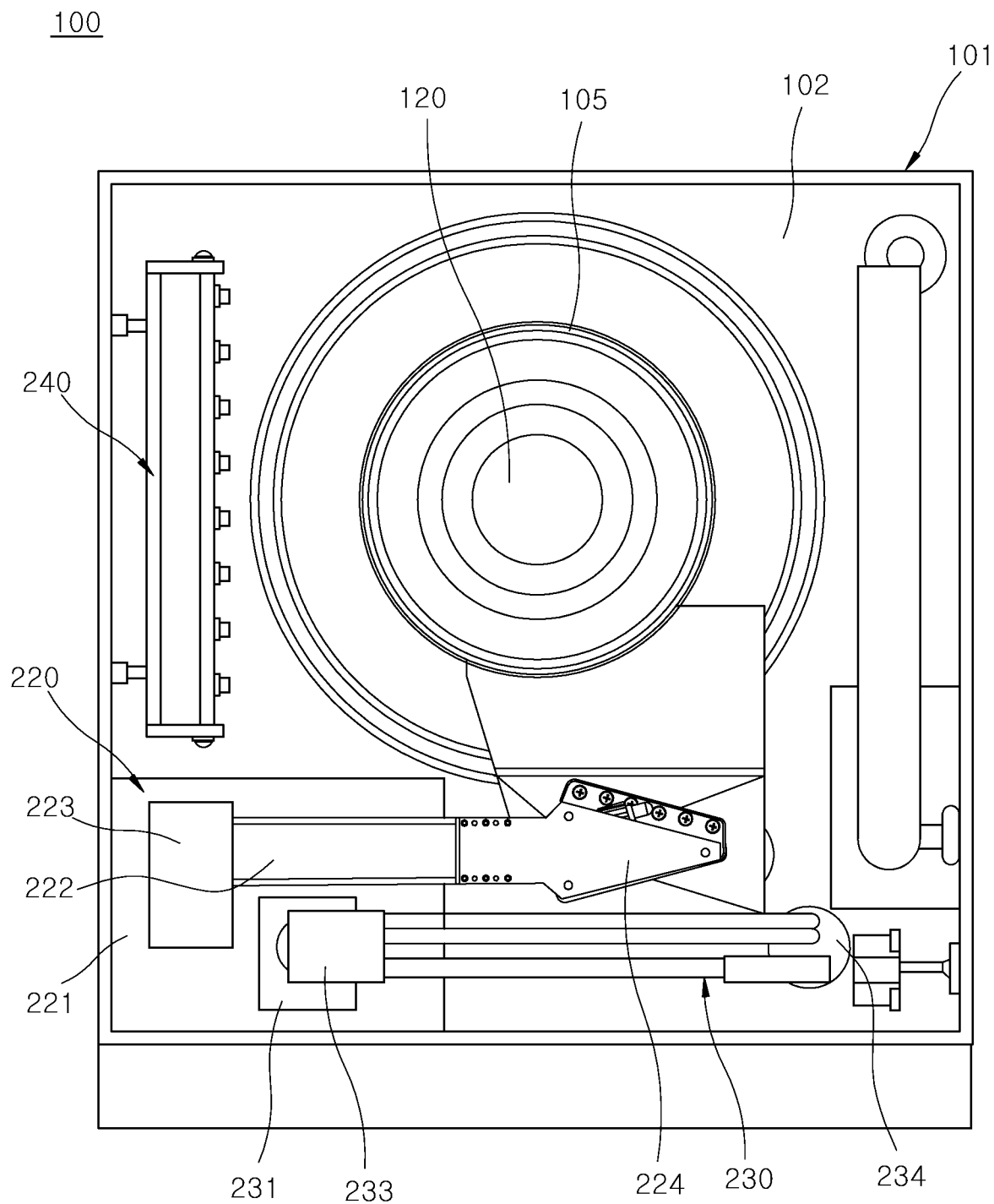
FIG. 14 is a schematic plan view illustrating a state in which an ultrasonic cleaning module and a cleaning solution spray module are disposed outside the vacuum chuck unit in the wafer cleaning apparatus according to one embodiment of the present invention.
Figure 15:
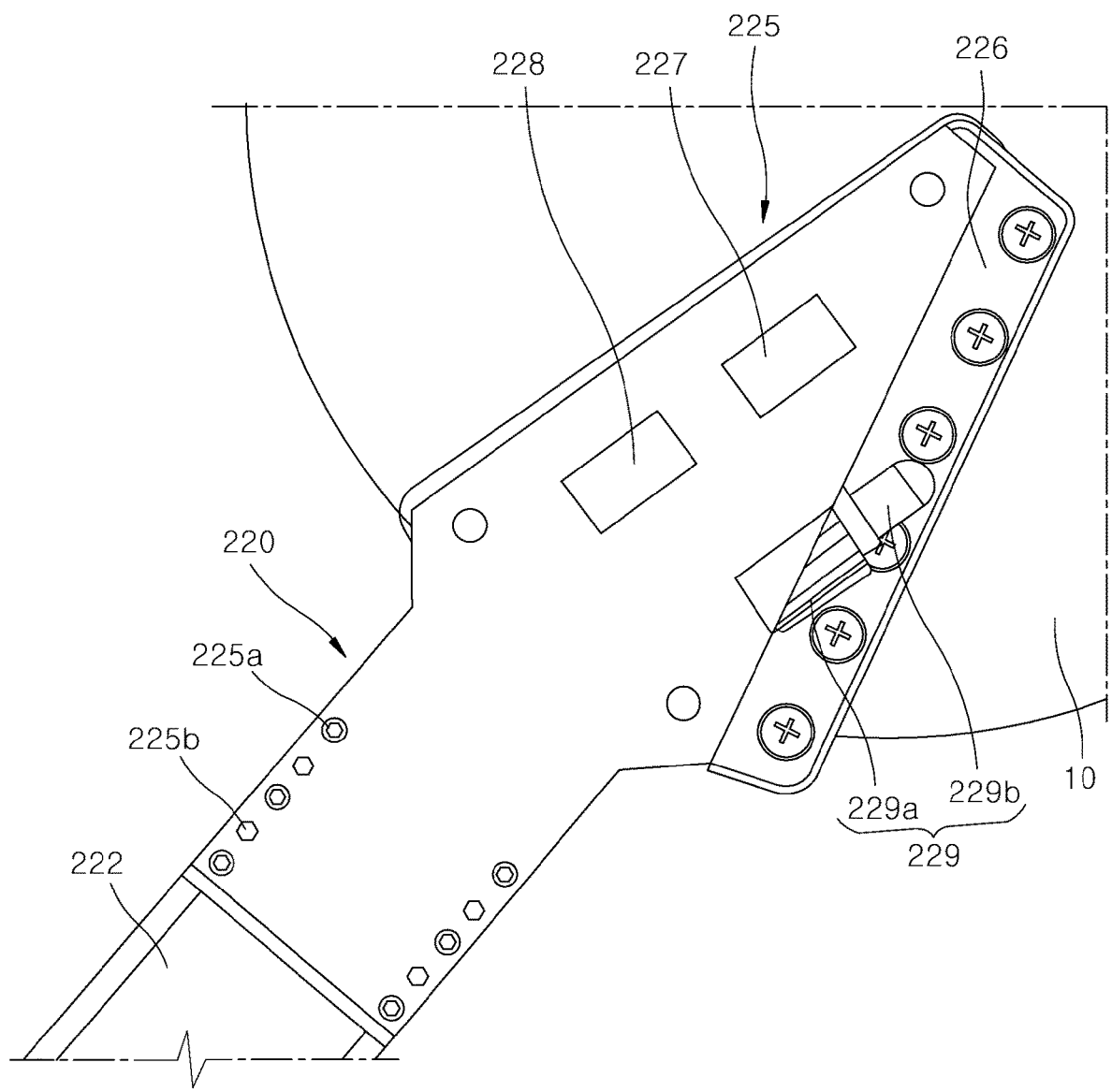
FIG. 15 is a schematic plan view illustrating the ultrasonic cleaning module in the wafer cleaning apparatus according to one embodiment of the present invention.
Figure 16:
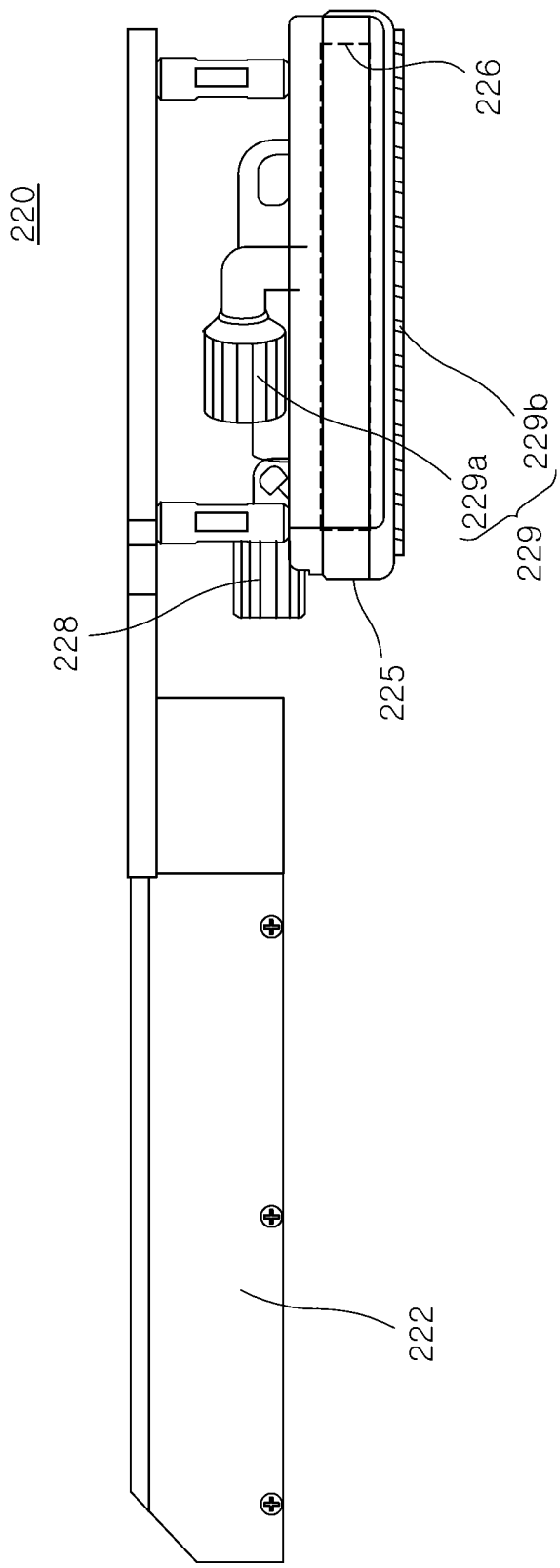
FIG. 16 is a schematic side view illustrating the ultrasonic cleaning module in the wafer cleaning apparatus according to one embodiment of the present invention.
Figure 17:
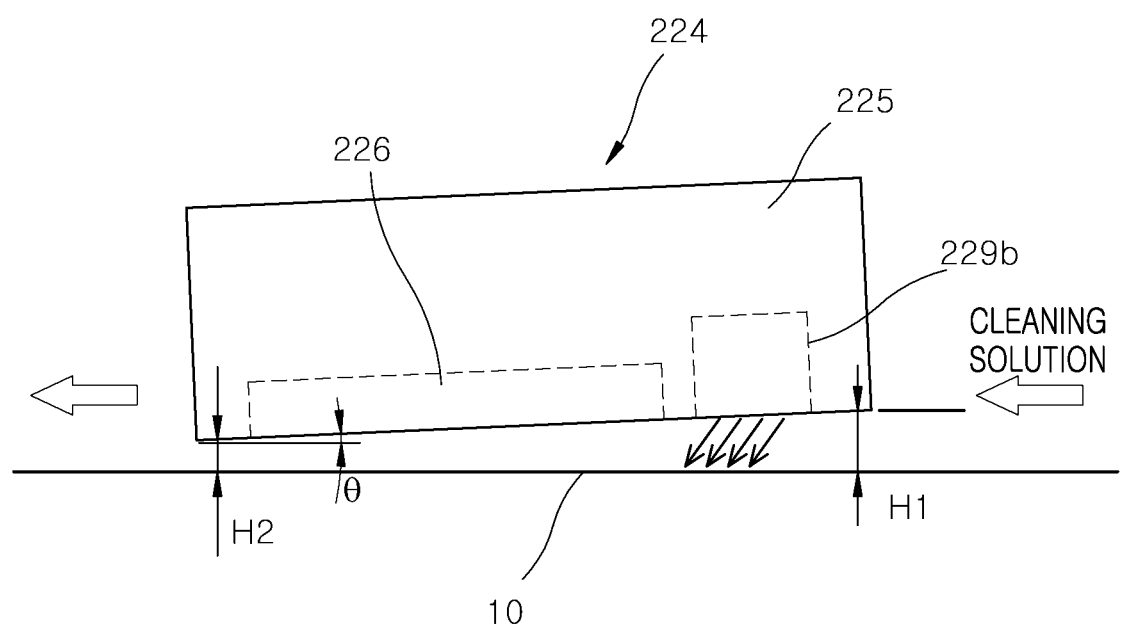
FIG. 17 is a schematic side view illustrating a state in which a cleaning head of the ultrasonic cleaning module is disposed to be inclined with respect to the wafer in the wafer cleaning apparatus according to one embodiment of the present invention.
Figure 18:
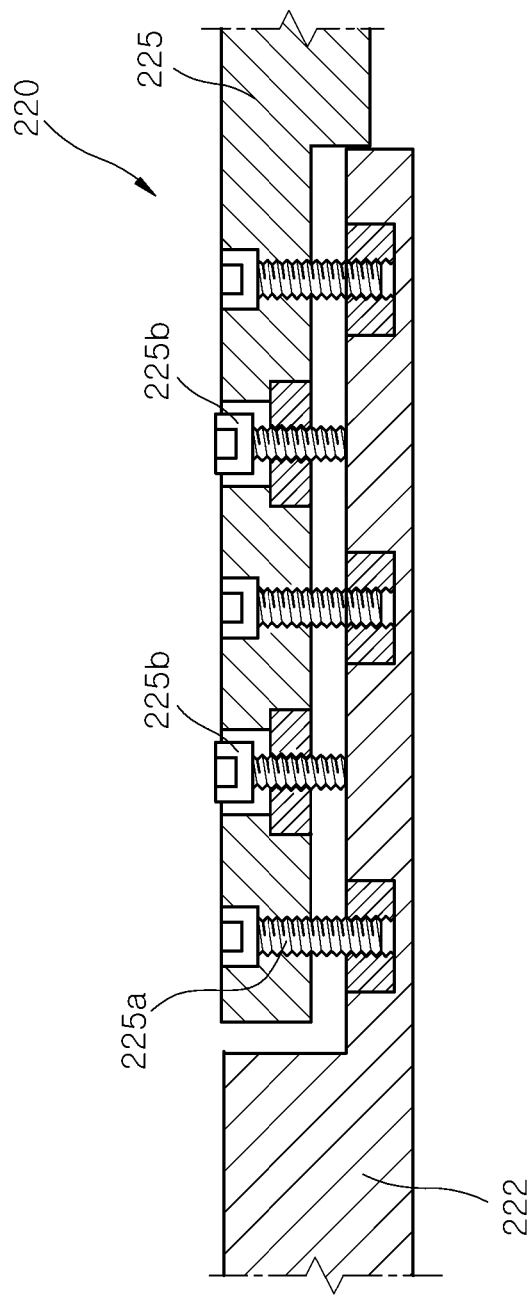
FIG. 18 is a schematic cross-sectional view illustrating coupling bolts and angle adjustment bolts of the cleaning head in the wafer cleaning apparatus according to one embodiment of the present invention.
Figure 19:
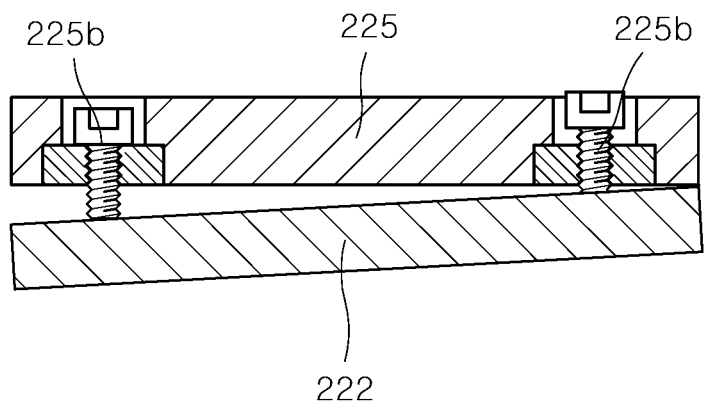
FIG. 19 is a schematic cross-sectional view illustrating a state in which the angle adjustment bolts are installed in the wafer cleaning apparatus according to one embodiment of the present invention.

FIG. 14 is a schematic plan view illustrating a state in which the ultrasonic cleaning module and a cleaning solution spray module are disposed outside the vacuum chuck unit in the wafer cleaning apparatus according to one embodiment of the present invention. FIG. 15 is a schematic plan view illustrating the ultrasonic cleaning module in the wafer cleaning apparatus according to one embodiment of the present invention. FIG. 16 is a schematic side view illustrating the ultrasonic cleaning module in the wafer cleaning apparatus according to one embodiment of the present invention. FIG. 17 is a schematic side view illustrating a state in which a cleaning head of the ultrasonic cleaning module is disposed to be inclined with respect to the wafer in the wafer cleaning apparatus according to one embodiment of the present invention. FIG. 18 is a schematic cross-sectional view illustrating coupling bolts and angle adjustment bolts of the cleaning head in the wafer cleaning apparatus according to one embodiment of the present invention. FIG. 19 is a schematic cross-sectional view illustrating a state in which the angle adjustment bolts are installed in the wafer cleaning apparatus according to one embodiment of the present invention.

Referring to FIGS. 14 to 19, the wafer cleaning apparatus 100 further includes the ultrasonic cleaning module 220 which sprays a cleaning solution onto the wafer 10 and applies ultrasonic waves to the cleaning solution to ultrasonically vibrate the cleaning solution. In this case, since the wafer 10 is cleaned by a chemical action of the cleaning solution and is physically cleaned by a cavitation phenomenon of ultrasonic waves, the cleaning efficiency of the wafer 10 can be considerably improved.

The ultrasonic cleaning module 220 applies ultrasonic waves to the cleaning solution in a state of being immersed in the cleaning solution. Accordingly, the cavitation phenomenon may actively proceed under the ultrasonic cleaning module 220.

The ultrasonic cleaning module 220 includes a lifting arm driving part 221, a lifting arm 222, a swing part 223, and an ultrasonic cleaning part 224. As the lifting arm driving part 221, a motor, a cylinder, or a ball screw is provided. The lifting arm 222 is connected to the lifting arm driving part 221 to be vertically moved by the lifting arm driving part 221. The swing part 223 is connected to the lifting arm 222 to rotate the lifting arm 222. The ultrasonic cleaning part 224 is connected to the lifting arm 222, sprays the cleaning solution onto the wafer 10, and applies ultrasonic waves to the cleaning solution. While the wafer 10 is mounted on the vacuum chuck unit 120, the swing part 223 is disposed outside the vacuum chuck unit 120, and after the wafer 10 is mounted on the vacuum chuck unit 120, the swing part 223 moves above the vacuum chuck unit 120.

The ultrasonic cleaning part 224 includes a cleaning head 225, an ultrasonic wave generator 226, a voltage applying part 227, an internal pressure forming part 228, and a cleaning solution spray part 229. The ultrasonic cleaning part 224 is disposed outside the cup housing 105.

The cleaning head 225 is connected to the lifting arm 222. The ultrasonic wave generator 226 is disposed inside the cleaning head 225 to apply ultrasonic waves to the cleaning solution. The voltage applying part 227 is disposed inside the cleaning head 225 to apply a voltage to the ultrasonic wave generator 226. An electric wire (not shown) is connected to the voltage applying part 227. The internal pressure forming part 228 is installed in the cleaning head 225 to form pressure higher than atmospheric pressure inside the cleaning head 225. The cleaning solution spray part 229 is formed in the cleaning head 225 to spray the cleaning solution onto the wafer 10. When the voltage applying part 227 applies a voltage to the ultrasonic wave generator 226, the ultrasonic wave generator 226 generates ultrasonic waves to ultrasonically vibrate the cleaning solution. In this case, since the internal pressure forming part 228 forms pressure higher than atmospheric pressure inside the cleaning head 225, the cleaning solution can be prevented from flowing into the cleaning head 225. Accordingly, the voltage applying part 227 and the ultrasonic wave generator 226 can be prevented from being short-circuited or damaged by the cleaning solution.

The cleaning solution spray part 229 includes a cleaning solution inflow portion 229a into which the cleaning solution flows and a plurality of spray nozzles 229b for spraying the cleaning solution discharged from the cleaning solution inflow portion 229a onto the wafer 10. The plurality of spray nozzles 229b may be formed in a row or a plurality of rows at a lower side of the cleaning head 225. The spray nozzles 229b are arranged in a radial direction of the wafer 10. Since the plurality of spray nozzles 229b spray the cleaning solution onto the wafer 10, the wafer 10 may be cleaned by spray pressure of the cleaning solution. In addition, since the plurality of spray nozzles 229b are arranged in the radial direction of the wafer 10, when the wafer 10 is rotated by the vacuum chuck unit 120, the cleaning solution may be sprayed onto the wafer 10 in a state in which the cleaning head 225 is positioned and fixed.

The plurality of spray nozzles 229b spray the cleaning solution to be inclined at a certain angle with respect to a direction in which the cleaning solution flows on the wafer 10 (see FIG. 17). For example, when the wafer 10 is rotated clockwise, the plurality of spray nozzles 229b spray the cleaning solution to be inclined clockwise with respect to the cleaning head 225. In addition, when the wafer 10 is rotated counterclockwise, the plurality of spray nozzles 229b spray the cleaning solution to be inclined counterclockwise with respect to the cleaning head 225. Accordingly, since the cleaning solution is guided to smoothly pass the lower side of the cleaning head 225, the stagnation of the cleaning solution can be prevented, and the fluidity of the cleaning solution can be secured.

An inflow side of a lower surface of the cleaning head 225 into which the cleaning solution flows is at a higher level than an outflow side thereof from which the cleaning solution flows out (H1>H2). Accordingly, the cleaning solution can be prevented from stagnating by colliding with a corner of the inflow side of the cleaning head 225. In addition, after the cleaning solution smoothly flows onto the lower surface of the cleaning head 225, the cleaning solution may more rapidly pass the lower surface of the cleaning head 225.

The cleaning head 225 further includes a plurality of coupling bolts 225a screw-coupled to the cleaning head 225 and the lifting arm 222 and angle adjustment bolts 225b screw-coupled the cleaning head 225 and the lifting arm 222 to adjust an angle θ (see FIG. 17) of the cleaning head 225 (see FIGS. 18 and 19). The plurality of coupling bolts 225a and the plurality of angle adjustment bolts 225b are installed at both sides of the cleaning head 225 in a width direction. Since the angle adjustment bolt 225b is coupled to the cleaning head 225 to protrude therefrom, the cleaning head 225 and one side of the lifting arm 222 are slightly spaced apart from each other, and the coupling bolt 225a is coupled to the cleaning head 225 and the lifting arm 222. Accordingly, since the cleaning head 225 is coupled in a state of being slightly skewed with respect to the lifting arm 222, an installation angle of the cleaning head 225 can be adjusted. The installation angle of the cleaning head 225 may be appropriately designed in consideration of the rotation speed of the wafer 10, the size of the wafer 10, the separation distance of the cleaning head 225, the viscosity of the cleaning solution, and the like.

The wafer cleaning apparatus 100 further includes a cleaning solution spray module 230 for spraying the cleaning solution onto the wafer 10. The cleaning solution spray module 230 may spray a cleaning solution including DIW and nitrogen gas onto the wafer 10.

The cleaning solution spray module 230 includes a turning arm driving part 231, a turning arm 232, a turning part 233, and a spray part 234.

As the turning arm driving part 23, a motor, a cylinder, or a ball screw is provided. The turning arm 232 is connected to the turning arm driving part 231 to be vertically moved by the turning arm driving part 231. The turning part 233 is connected to the turning arm 232 to rotate the turning arm 232. The spray part 234 is connected to the turning arm 232 and sprays the cleaning solution onto the wafer 10.

The spray part 234 may include one spray nozzle. Since one spray nozzle sprays the cleaning solution onto the wafer 10, when the wafer 10 is rotated by the vacuum chuck unit 120, the one spray nozzle sprays the cleaning solution onto the wafer 10 when the spray part 234 repeatedly turns in a certain angle range.

The ultrasonic cleaning module 220 and the cleaning solution spray module 230 may be selectively used according to a processing process of the wafer 10.

Figure 20:
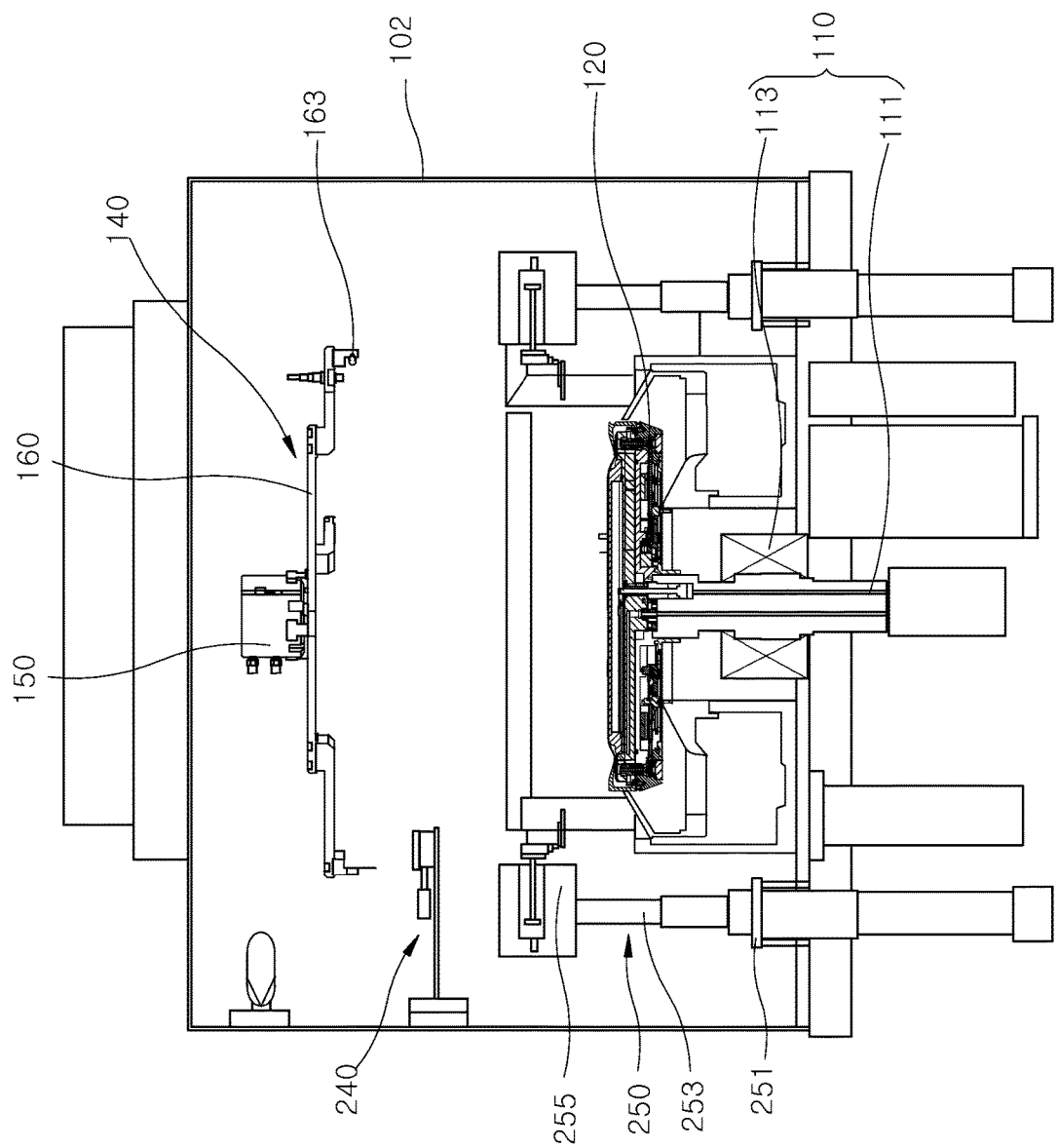
FIG. 20 is a schematic side view illustrating an ionizer and a transfer unit of the wafer cleaning apparatus according to one embodiment of the present invention.

FIG. 20 is a schematic side view illustrating an ionizer and a transfer unit of the wafer cleaning apparatus according to one embodiment of the present invention.

Referring to FIG. 20, an ionizer 240 is installed inside the case 101. The ionizer 240 is disposed at an upper side of the chamber unit 102 and removes static electricity generated during a processing process and a non-processing process of the wafer 10. Since the ionizer 240 prevents static electricity from being generated on the wafer 10 and inside the chamber unit, foreign materials can be prevented from being reattached to the wafer 10 by static electricity.

When air as a supply gas is supplied to the ionizer 240 and DIW as a cleaning solution is supplied, positive ions and negative ions ionized through the ionizer 240, along with the cleaning solution, may be sprayed onto the wafer.

Before DIW including positive ions and negative ions is sprayed onto the wafer 10, an electrostatic potential of the wafer 10 was measured to be about 3.6 KV. On the other hand, after DIW including positive ions and negative ions is sprayed onto the wafer 10, the electrostatic potential was measured to be in a range of about −0.10 KV to −0.17 KV. Since the electrostatic potential appears as such a negative voltage, an amount of positive ions generated by the ionizer 240 is increased, thereby controlling the static electricity of the wafer 10 to be "zero" which is an ideal value.

A transfer unit 250 is installed in the chamber unit 102 to receive the wafer 10 from a transport unit (not shown). The transfer unit 250 includes a transfer moving part 251 movably installed on a bottom surface of the chamber unit 102, a transfer lifting part 253 installed on the transfer moving part 251, and a transfer mounting part 255 installed on the transfer lifting part 253. When the wafer 10 transferred from the transport unit is mounted on the transfer mounting part 255, the transfer lifting part 253 is moved to both sides of the vacuum chuck unit 120 by the transfer moving part. When the transfer lifting part 253 lowers the transfer mounting part 255, the wafer 10 is mounted on the vacuum chuck unit 120. After the wafer 10 is mounted on the vacuum chuck unit 120, the transfer unit 250 returns to the original position thereof to receive the wafer 10 from the transport unit.

A method of controlling the wafer cleaning apparatus according to one embodiment of the present invention configured as described above will be described.

Figure 21:
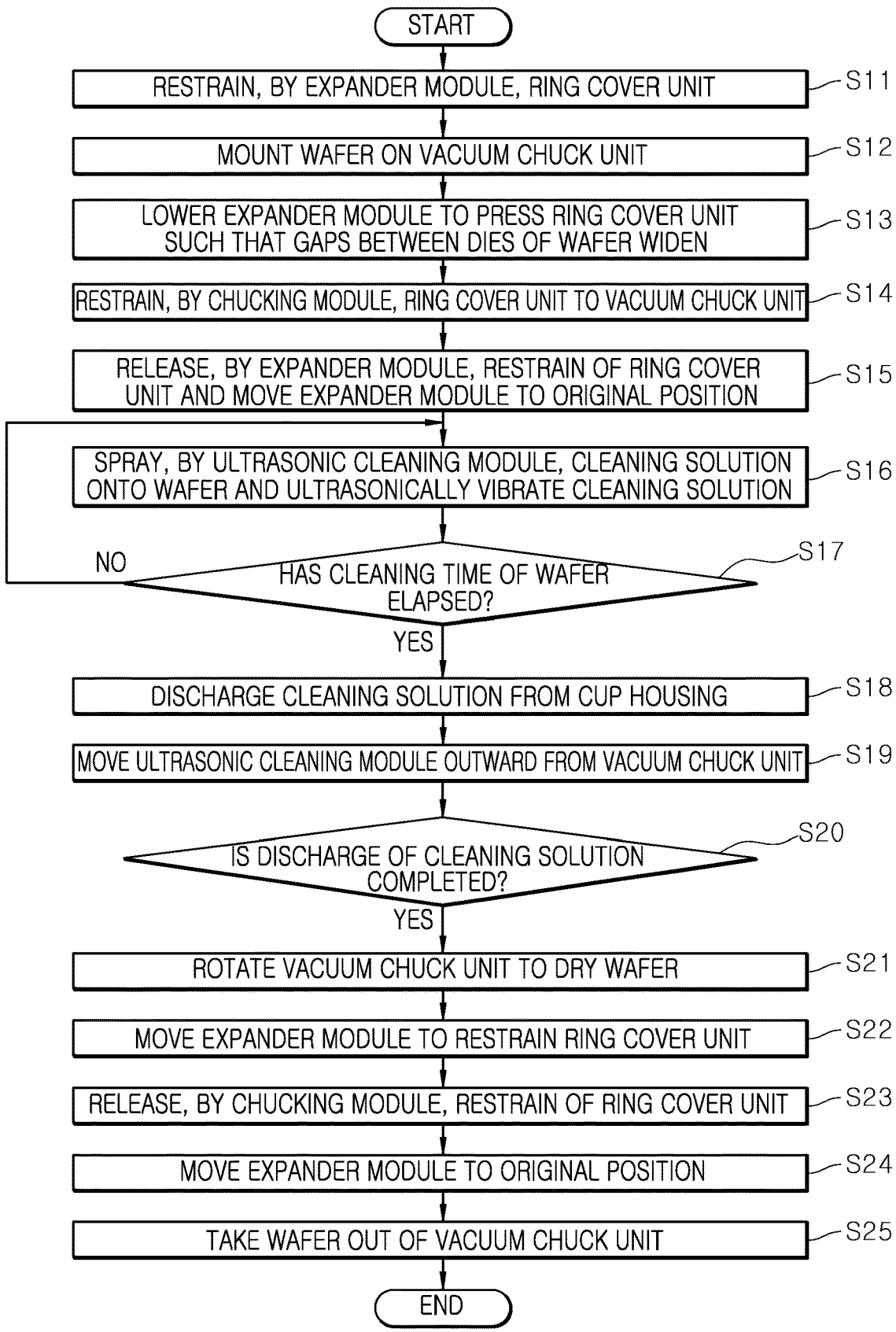
FIG. 21 is a flowchart illustrating a method of controlling a wafer cleaning apparatus according to one embodiment of the present invention.

FIG. 21 is a flowchart illustrating a method of controlling a wafer cleaning apparatus according to one embodiment of the present invention.

Referring to FIG. 21, an expander module 140 restrains a ring cover unit 130 (S11). In this case, a plurality of expander arms 160 of the expander module 140 are moved outward by an expander head 150, a catch portion 163 of the expander arm 160 faces the ring cover unit 130, and as the plurality of expander arms 160 are moved inward by the expander head 150, the catch portion 163 restrains the ring cover unit 130.

A transfer unit 250 mounts a wafer 10 on a vacuum chuck unit 120 (S12). In this case, the transfer unit 250 receives the wafer 10 from a transport unit, as a transfer moving part of the transfer unit 250 moves to both sides of the vacuum chuck unit 120, a transfer mounting part 255 moves above the vacuum chuck unit 120, and the transfer mounting part 255 of the transfer unit 250 is lowered so that the wafer 10 is mounted on the vacuum chuck unit 120. When the wafer 10 is mounted on the vacuum chuck unit 120, the transfer unit 250 returns to the original position thereof to receive a new wafer 10.

The expander module 140 is lowered to press the ring cover unit 130 such that gaps between dies 11 of the wafer 10 widen (S13). In this case, the expander module 140 holds the ring cover unit 130 and moves above the wafer 10, and as the expander module 140 is lowered, the expander arm 160 of the expander module 140 presses the ring cover unit 130 downward. When the ring cover unit 130 moves downward while pressing a retainer ring portion 13 downward, an adhesive sheet 12 of the wafer 10 is pulled in a radial direction and thus is stretched in the radial direction. As the adhesive sheet 12 is stretched in the radial direction, the gaps between the plurality of dies 11 widen.

When the expander module 140 completely presses the ring cover unit 130, a chucking module 170 restrains the ring cover unit 130 to the vacuum chuck unit 120 (S14). That is, when a chucking rotating part 175 of the chucking module 170 is driven by being engaged with a base gear portion 174, as a chucking base 171 is rotated at a certain angle, a chucking link part 180 moves outward. As a link gear portion 183 of the chucking link part 180 is driven by being engaged with a restraining gear portion 192 of a cover restraining part 190, a cover restraining bar 193 and a restraining roller 194 are rotated to restrain a restraining stepped portion 132 of the ring cover unit 130. As the cover restraining part 190 restrains the ring cover unit 130, since the retainer ring portion 13 of the wafer 10 remains lowered without any change, the gaps between the dies 11 are maintained in a state of being widened in the wafer 10.

When the cover restraining part 190 completely restrains the ring cover unit 130, the expander module 140 releases the restraint of the ring cover unit 130 and moves to a standby position (S15). In this case, the expander module 140 is sufficiently spaced apart from the vacuum chuck unit 120 such that an ultrasonic cleaning module 220 does not collide with or come into contact with the expander module 140 when the ultrasonic cleaning module 220 moves above the vacuum chuck unit 120.

The ultrasonic cleaning module 220 sprays a cleaning solution onto the wafer 10 and ultrasonically vibrates the cleaning solution (S16). In this case, the ultrasonic cleaning module 220 applies ultrasonic waves to the cleaning solution in a state of being immersed in the cleaning solution. That is, a lifting arm 222 is lifted by a lifting arm driving part 221, a swing part 223 rotates the lifting arm 222 above the vacuum chuck unit 120, the lifting arm driving part 221 lowers the lifting arm 222 such that a cleaning head 225 of the ultrasonic cleaning module 220 is immersed in the cleaning solution, a cleaning solution spray part 229 sprays the cleaning solution onto the wafer 10, and an ultrasonic wave generator 226 ultrasonically vibrates the cleaning solution.

In this case, since the gaps between the plurality of dies 11 are maintained in a state of being widened, foreign materials between the dies 11 can be removed more rapidly and easily. In addition, the wafer 10 can be cleaned more rapidly and cleanly by spray pressure of the cleaning solution and ultrasonic vibration of the cleaning solution.

It is determined whether a cleaning time of the wafer 10 has elapsed (S17). In this case, the cleaning time of the wafer 10 is preset in a control unit (not shown).

When the cleaning time of the wafer 10 has elapsed, the cleaning solution is discharged from a cup housing 105

(S18). The cleaning solution discharged from the cup housing 105 is collected again in a cleaning solution collection tank (not shown).

In addition, the ultrasonic cleaning module 220 moves outward from the vacuum chuck unit 120 (S19). In this case, as the lifting arm driving part 221 lifts the lifting arm 222 and the swing part 223 turns the lifting arm 222, an ultrasonic cleaning part 224 moves outward from the vacuum chuck unit 120.

It is determined whether the discharge of the cleansing solution is completed (S20). In this case, a discharge time of the cleaning solution is preset in the control unit. In addition, whether the cleaning solution is completely discharged from the cup housing 105 may be detected through a discharge detection sensor (not shown).

The vacuum chuck unit 120 is rotated to dry the wafer 10 (S21). In this case, the cleaning solution is not supplied to the cup housing 105. As the vacuum chuck unit 120 is rotated, the cleaning solution remaining on the wafer 10 is removed from the wafer 10 by a centrifugal force. In this case, since the wafer 10 is rotated by the vacuum chuck unit 120 in a state in which the gaps between the die 11 of the wafer 10 widen, the cleaning solution remaining between the dies 11 can be removed more rapidly. In addition, air or gas may be sprayed onto the wafer 10 to expedite the drying of the wafer 10.

The expander module 140 moves to restrain the ring cover unit 130 (S22). In this case, the expander module 140 is lowered toward the vacuum chuck unit 120, and the catch portion 163 of the expander arm 160 faces the ring cover unit 130. When the expander head 150 moves the expander arm 160 inward, a catch body 164 is pressed against the ring cover unit 130, and a catch pin 165 of the catch portion 163 is inserted into a cover hole 135 of the ring cover unit 130 to restrain the ring cover unit 130.

The chucking module 170 releases the restraint of the ring cover unit 130 (S23). In this case, when the chucking rotating part 175 rotates the chucking base 171 at a certain angle, the chucking link part 180 moves toward a center of the chucking base 171. As the link gear portion 183 is driven by being engaged with the restraining gear portion 192, the cover restraining bar 193 and the restraining roller 194 deviate from the restraining stepped portion 132 of the ring cover unit 130. Even when the restraint of the ring cover unit 130 is released, the expander module 140 maintains a state in which the ring cover unit 130 is pressed.

The expander module 140 moves to a standby position (S24). In this case, as an expander moving part 141 is lifted, the expander head 150 and the expander arm 160 are lifted. When the expander arm 160 is lifted in a state in which the ring cover unit 130 is restrained, as the retainer ring portion 13 of the wafer 10 is lifted, the adhesive sheet 12 of the wafer 10 is contracted to the original state thereof. Accordingly, the gap between the dies 11 of the wafer 10 returns to the original state.

The wafer 10 is taken out of the vacuum chuck unit 120 (S25). In this case, the transfer moving part 251 of the transfer unit 250 moves to both sides of the vacuum chuck unit 120, and the transfer lifting part 253 is lowered. As the transfer mounting part 255 is rotated, the wafer 10 is mounted on the transfer mounting part 255. When the transfer moving part 251 is transferred to a discharge position of the wafer 10, the transport unit receives the wafer 10 and moves the wafer 10 to the outside of a chamber unit 102. The transport unit transfers the wafer 10 to a wafer storage unit or a subsequent process.

According to the present invention, since a cleaning process is performed in a state in which gaps between dies in a wafer widen, foreign materials attached to surfaces of the dies as well as foreign materials positioned in the gaps between the plurality of dies can be easily removed by a cleaning solution. Therefore, wafer cleaning performance can be considerably improved, and a defect rate of the wafer can be considerably reduced.

In addition, according to the present invention, since a ring cover unit is restrained to a vacuum chuck unit as a chucking base is rotated by a chucking rotating part, the wafer can be restrained to the vacuum chuck unit using one chucking rotating part. Accordingly, the structure of a wafer cleaning apparatus can be simplified.

Furthermore, according to the present invention, since a height adjustment part adjusts an installation height of a cover restraining part, it is possible to adjust a height between an upper surface of the ring cover unit and an upper surface of the vacuum chuck unit. Accordingly, a degree of stretching of an adhesive sheet of the wafer is adjusted, thereby adjusting the gaps between the plurality of dies.

In addition, according to the present invention, an ultrasonic cleaning module sprays a cleaning solution onto the wafer and applies ultrasonic waves to the cleaning solution to ultrasonically vibrate the cleaning solution. Accordingly, since the wafer is cleaned by a chemical action of the cleaning solution and is physically cleaned by a cavitation phenomenon of ultrasonic waves, the cleaning efficiency of the wafer can be considerably improved.

While the present invention has been described with reference to embodiments shown in the drawings, these should be considered in a descriptive sense only, and it will be understood by those skilled in the art that various alterations and other equivalent embodiments may be made.

Accordingly, the true scope of protection of the present invention should be defined only by the appended claims.

What is claimed is:

1. A wafer cleaning apparatus comprising:
    a vacuum chuck unit on which a wafer is mounted;
    a ring cover unit facing a retainer ring portion of the wafer;
    an expander module installed to move the ring cover unit and configured to press the retainer ring portion toward the vacuum chuck unit such that a gap between dies of the wafer widens; and
    a chucking module installed in the vacuum chuck unit to restrain the ring cover unit pressed by the expander module to the vacuum chuck unit.

2. The wafer cleaning apparatus of claim 1, wherein the expander module includes:
    an expander moving part;
    an expander head installed at the expander moving part; and
    a plurality of expander arms connected to the expander head to hold and move the ring cover unit and configured to press the ring cover unit such that the chucking module restrains the ring cover unit to the vacuum chuck unit.

3. The wafer cleaning apparatus of claim 2, wherein, when the chucking module restrains the ring cover unit to the vacuum chuck unit, the plurality of expander arms releases a press applied to the ring cover unit.

4. The wafer cleaning apparatus of claim 2, wherein the expander head includes:
    an expander casing connected to the expander moving part;

a plurality of expander sliders coupled to the expander casing to be radially movable and each connected to one of the plurality of expander arms;

an expander rod disposed inside the expander casing to move the plurality of expander sliders; and an expander driving part disposed in the expander casing to move the expander rod.

5. The wafer cleaning apparatus of claim 4, wherein the expander casing includes:

a casing body having a movement space, in which the expander rod moves, formed therein;

a first blocking plate configured to block one side of the casing body; and a second blocking plate which blocks the other side of the casing body and has a movement hole, into which the expander rod is movably inserted, formed therein.

6. The wafer cleaning apparatus of claim 4, wherein the expander rod includes:

a moving disk portion movably installed in a movement space of the expander casing;

a plunger portion connected to the moving disk portion to be inserted into a movement hole of the expander casing; and a push portion connected to the plunger portion and the plurality of expander sliders to move the plurality of expander sliders as the plunger portion moves.

7. The wafer cleaning apparatus of claim 4, wherein each of the plurality of expander arms includes:

an arm member connected to one of the plurality of expander sliders; and a catch portion disposed at the arm member to restrain the ring cover unit.

8. The wafer cleaning apparatus of claim 1, wherein the chucking module includes:

a chucking base installed in the vacuum chuck unit;

a chucking rotating part connected to the chucking base to rotate the chucking base;

a plurality of chucking link parts which are each radially connected to the chucking base and move when the chucking base rotates; and a plurality of cover restraining parts each connected to one of the chucking link parts to restrain the ring cover unit to the vacuum chuck unit when the chucking link parts move.

9. The wafer cleaning apparatus of claim 8, wherein the chucking base includes:

a base body formed in an annular shape to be concentric with a rotating shaft of the vacuum chuck unit;

a plurality of guide portions formed in the base body such that the chucking link parts are movably coupled thereto; and a base gear portion formed on the base body and connected to the chucking rotating part.

10. The wafer cleaning apparatus of claim 9, wherein the guide portion is formed to be inclined with respect to a radial direction of the base body.

* * * * *